United States Patent
Ko et al.

(10) Patent No.: US 12,557,370 B2
(45) Date of Patent: Feb. 17, 2026

(54) SEMICONDUCTOR DEVICE MANUFACTURING METHOD

(71) Applicant: SAMSUNG ELECTRONICS CO., LTD., Suwon-si (KR)

(72) Inventors: Eun Hyea Ko, Suwon-si (KR); Hoon Han, Anyang-si (KR); Byung Keun Hwang, Seongnam-si (KR); Jeong Ho Mun, Yongin-si (KR); Hyun-Ji Song, Anyang-si (KR); Youn Joung Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 481 days.

(21) Appl. No.: 18/053,157

(22) Filed: Nov. 7, 2022

(65) Prior Publication Data
US 2023/0142732 A1    May 11, 2023

(30) Foreign Application Priority Data
Nov. 9, 2021   (KR) .................. 10-2021-0152838

(51) Int. Cl.
| | |
|---|---|
| *H10D 84/03* | (2025.01) |
| *H01L 21/28* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/85* | (2025.01) |

(52) U.S. Cl.
CPC ..... *H10D 84/038* (2025.01); *H01L 21/28088* (2013.01); *H10D 30/014* (2025.01); *H10D 30/43* (2025.01); *H10D 30/6735* (2025.01); *H10D 30/6739* (2025.01); *H10D 62/121* (2025.01); *H10D 84/0167* (2025.01); *H10D 84/0177* (2025.01); *H10D 84/85* (2025.01)

(58) Field of Classification Search
CPC ................................................. H10D 84/0135
See application file for complete search history.

(56) References Cited

U.S. PATENT DOCUMENTS

| | | |
|---|---|---|
| 8,828,863 B1 | 9/2014 | Lee et al. |
| 9,040,421 B2 | 5/2015 | Zhang et al. |

(Continued)

FOREIGN PATENT DOCUMENTS

KR     20200038425 A    4/2020

*Primary Examiner* — Brian Turner
(74) *Attorney, Agent, or Firm* — Wolf, Greenfield & Sacks, P.C.

(57) ABSTRACT

The present disclosure provides a method for manufacturing a semiconductor device using selective vapor deposition and selective desorption. The method for manufacturing a semiconductor device includes providing a first layer having a first surface, and forming a second layer on the first layer such that a portion of the first surface is not covered by the second layer. The second layer has a second surface that meets the first surface. An inhibitor layer is formed on the first surface and the second surface, and the inhibitor layer on the second surface is selectively removed to expose the second surface. An interest layer is formed on the second surface. Physical properties of the first layer are different from physical properties of the second layer.

18 Claims, 32 Drawing Sheets

(56) References Cited

U.S. PATENT DOCUMENTS

| | | | |
|---|---|---|---|
| 10,497,613 B2 | 12/2019 | Chawla et al. | |
| 2007/0256728 A1* | 11/2007 | Cousins | H10F 77/935 |
| | | | 136/252 |
| 2015/0171241 A1* | 6/2015 | Valckx | H10F 77/1692 |
| | | | 438/98 |
| 2015/0207104 A1* | 7/2015 | Mukunoki | H10K 50/854 |
| | | | 204/192.18 |
| 2016/0225940 A1* | 8/2016 | Kim | H10F 77/211 |
| 2020/0035501 A1 | 1/2020 | Tabata et al. | |
| 2020/0105515 A1 | 4/2020 | Maes et al. | |
| 2020/0105592 A1 | 4/2020 | Kuo et al. | |
| 2021/0057273 A1* | 2/2021 | Chen | H01L 23/53209 |
| 2021/0098257 A1 | 4/2021 | Sharma et al. | |

\* cited by examiner

SEMICONDUCTOR DEVICE MANUFACTURING METHOD

CROSS-REFERENCE TO RELATED APPLICATION

This application claims priority under 35 U.S.C. § 119 to Korean Patent Application No. 10-2021-0152838 filed on Nov. 9, 2021 in the Korean Intellectual Property Office, the contents of which are herein incorporated by reference in their entirety.

BACKGROUND

1. Field of the Disclosure

The present disclosure relates to methods for manufacturing semiconductor devices, specifically, methods for manufacturing a semiconductor device using vapor deposition and desorption.

2. Description of the Related Art

There is increased demand for semiconductor devices with enhanced functionality. In order to meet performance and price requirements of consumers, the degree of integration and miniaturization of semiconductor elements has increased. The significance of electrically separating integrated elements has also increased with the increase in integration and miniaturization.

SUMMARY

Aspects of the present inventive concept provide methods for manufacturing semiconductor devices using selective vapor deposition and selective desorption.

However, aspects of the present inventive concept are not restricted to the one set forth herein. The above and other aspects of the present inventive concept will become more apparent to one of ordinary skill in the art to which the present inventive concept pertains by referencing the detailed description of the present disclosure given below.

According to an aspect of the present inventive concept, there is provided a method for manufacturing a semiconductor device, the method comprising, providing a first layer having a first surface, forming a second layer on the first layer such that a portion of the first surface is not covered by the second layer, wherein the second layer has a second surface that meets the first surface, forming an inhibitor layer on the first surface and the second surface, selectively removing the inhibitor layer from the second surface to expose the second surface, and forming an interest layer on the second surface, wherein physical properties of the first layer are different from physical properties of the second layer.

According to another aspect of the present inventive concept, there is provided a method for manufacturing a semiconductor device, the method comprising, forming a gap fill insulating layer on a titanium nitride layer, etching the gap fill insulating layer to form a first gap fill insulating pattern and a second gap fill insulating pattern, the first gap fill insulating pattern including a first surface facing the second gap fill insulating pattern, and the second gap fill insulating pattern including a second surface facing the first surface, wherein the first gap fill insulating pattern and the second gap fill insulating pattern expose an upper surface of the titanium nitride layer, forming a first inhibitor layer on the upper surface of the titanium nitride layer, forming a second inhibitor layer on the first surface and the second surface, selectively removing the second inhibitor layer using a heat treatment process to expose the first surface and the second surface, and depositing an interest layer on the first surface and the second surface, wherein the interest layer exposes the first inhibitor layer.

According to another aspect of the present disclosure, there is provided a method for manufacturing a semiconductor device, the method comprising, forming a first sheet pattern on a first region of the substrate, forming a second sheet pattern on a second region of the substrate, forming a work function metal layer on the substrate, wherein the work function metal layer extends around the first sheet pattern and the second sheet pattern, forming a sacrificial layer on the first and second sheet patterns, forming a trench that penetrates the sacrificial layer between the first sheet pattern and the second sheet pattern, wherein the trench exposes a portion of the work function metal layer, forming an inhibitor layer on a bottom surface and a side surface of the trench, performing a heat treatment process to selectively remove the inhibitor layer on the side surface of the trench, and selectively forming an interest layer on the side surface of the trench, wherein the work function metal layer includes titanium nitride.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION OF THE EMBODIMENTS

Hereinafter, methods for manufacturing semiconductor devices according to some example embodiments will be described referring to FIGS. 1 to 6.

Figure 1:
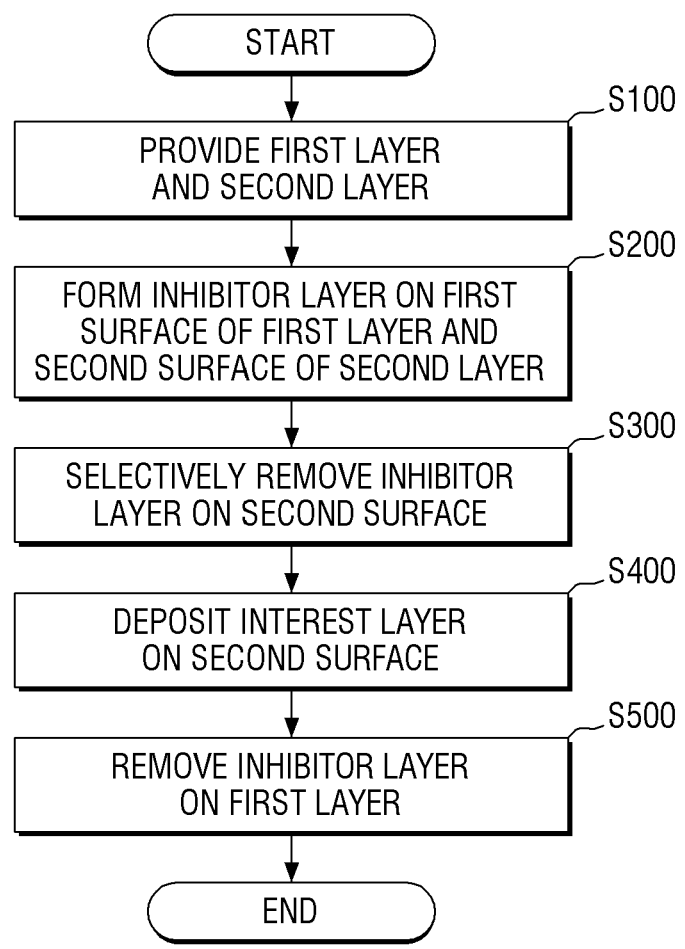
FIG. 1 is a flowchart for explaining methods for manufacturing semiconductor devices according to some example embodiments.

FIG. 1 is an example flowchart for explaining methods for manufacturing semiconductor devices according to some embodiments. FIGS. 2 to 6 are intermediate views for explaining methods for manufacturing semiconductor devices according to some example embodiments.

Figure 2:
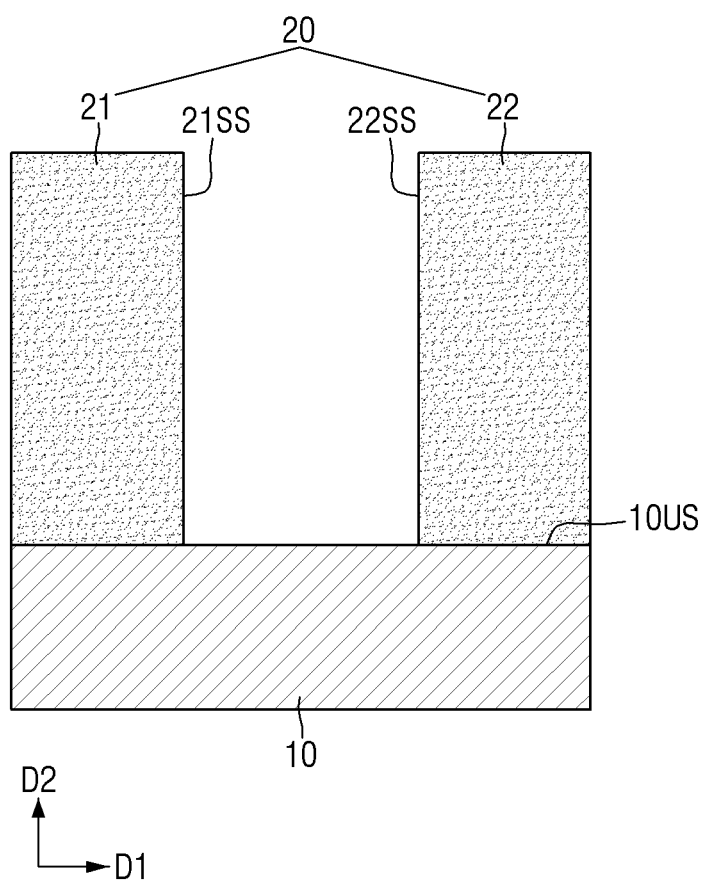
FIGS. 2 to 6 are intermediate views for explaining methods for manufacturing semiconductor devices according to some example embodiments.

Referring to FIGS. 1 and 2, a first layer 10 and a second layer 20 may be provided (S100).

The first layer 10 may be a titanium nitride layer. That is, the first layer 10 may include, for example, titanium nitride (TiN), an organic polymer, and a combination thereof. The second layer 20 may be a gap fill insulating layer. The second layer 20 may be, for example, but is not limited to, a dry etch resistance layer or a wet etch resistance layer.

The second layer 20 is formed on an upper surface 10US of the first layer 10. A part of the upper surface 10US of the first layer 10 comes into contact with the second layer 20, and the other part of the upper surface 10US of the first layer 10 may be exposed by the second layer 20, as illustrated in FIG. 2. For example, the second layer 20 may include a first sub-layer 21 and a second sub-layer 22. Although not shown, the first sub-layer 21 and the second sub-layer 22 may be formed by etching the second layer 20 in a second direction D2. The first sub-layer 21 may be a first gap fill insulating pattern, and the second sub-layer 22 may be a second gap fill insulating pattern.

The first sub-layer 21 and the second sub-layer 22 may be spaced apart from each other in a first direction D1. The upper surface 10US of the first layer 10 may be exposed in a space in which the first sub-layer 21 and the second sub-layer 22 are spaced apart from each other. Hereinafter, the exposed upper surface 10US of the first layer 10 is defined as a first surface. The first sub-layer 21 includes a first surface 21SS. The first surface 21SS of the first sub-layer 21 may face the second sub-layer 22. The second sub-layer 22 includes a second surface 22SS. The second surface 22SS of the second sub-layer 22 may face the first sub-layer 21. That is, the first surface 21SS of the first sub-layer 21 and the second surface 22SS of the second sub-layer 22 may face each other. Hereinafter, the first surface 21SS of the first sub-layer 21 and the second surface 22SS of the second sub-layer 22 are defined as a second surface.

That is, the first surface 10US may extend in the first direction D1, and the second surfaces 21SS and 22SS may extend in the second direction D2. The first direction D1 and the second direction D2 may intersect each other (i.e., are transverse to each other and contact each other, as illustrated in FIG. 2). The first direction D1 and the second direction D2 may be substantially perpendicular to each other.

The first surface 10US may include a hydroxy group or an amine group through a surface pretreatment process, for example, a dry etching process, a wet etching process, a wet cleaning process, or the like. Further, the first surface 10US may include a metal or a combination of a metal and an organic polymer. For example, the first surface 10US includes a combination of titanium nitride (TiN) and an organic polymer, and may include a hydroxyl group or an amine group through the dry etching process, the wet etching process, the wet cleaning process, or the like.

The second layer 20 may include an acid precursor. When a stimulus such as heat, light, and an electromagnetic wave is applied to the second layer 20, the second layer 20 may emit acid or hydrogen cation. The second surfaces 21SS and 22SS may include a hydroxy group or an amine group through a surface pretreatment process, for example, a dry etching process, a wet etching process, a wet cleaning process, or the like.

Figure 3:
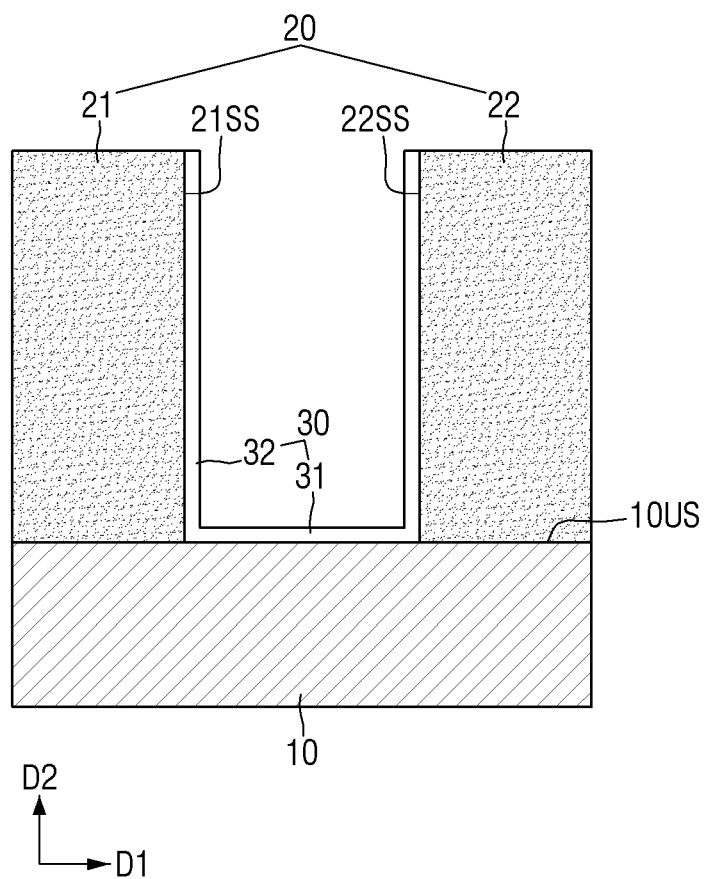

Referring to FIGS. 1 and 3, an inhibitor layer 30 may be formed on the first surface 10US of the first layer 10 and the second surfaces 21SS and 22SS of the second layer 20 (S200).

The inhibitor layer 30 may be conformally formed on the first surface 10US of the first layer 10 and the second surfaces 21SS and 22SS of the second layer 20, but is not limited thereto. The formation of the inhibitor layer 30 may be performed under temperature conditions of from about 80° C. to about 240° C. The formation time of the inhibitor layer 30 may take a minimum of about 1 minute to a maximum of about 20 minutes. However, the present inventive concept is not limited thereto, and the temperature for forming the inhibitor layer 30 and the time for forming the inhibitor layer 30 may vary depending on the process conditions and circumstances.

The inhibitor layer 30 may include a first inhibitor layer 31 and a second inhibitor layer 32. The first inhibitor layer 31 may be formed on the first surface 10US. The first inhibitor layer 31 may extend in the first direction D1 along the first surface 10US. The second inhibitor layer 32 may be formed on the second surfaces 21SS and 22SS. The second inhibitor layer 32 may extend in the second direction D2 along the second surfaces 21SS and 22SS.

The inhibitor layer 30 may include a material that is dissociated by acid or hydrogen cation. The inhibitor layer 30 may include a protecting group that is dissociated by acid. For example, the inhibitor layer 30 may include, but is not limited to, a trimethylsilyl group. The inhibitor layer 30 may include an ester group or an ether group.

The inhibitor layer 30 is, for example, at least one of hexamethyldisilazane (HMDS), trimethylsilyldiethylamine, bis(N,N-dimethylamino)dimethylsilane, trimethylsilyldimethylamine, bis(trimethylsilyl)hydrazine, and trimethylchlorosilane.

The inhibitor layer 30 may be formed to have a very thin thickness. For example, the thickness of the inhibitor layer 30 may be about 20 angstroms (Å) or less. Preferably, the thickness of the inhibitor layer 30 may be about 10 angstroms (Å) or less. For example, a width of the first inhibitor layer 31 in the second direction D2 may be about 10 angstroms (Å) or less. A width of the second inhibitor layer 32 in the first direction D1 may be about 10 angstroms (Å) or less.

Figure 4:
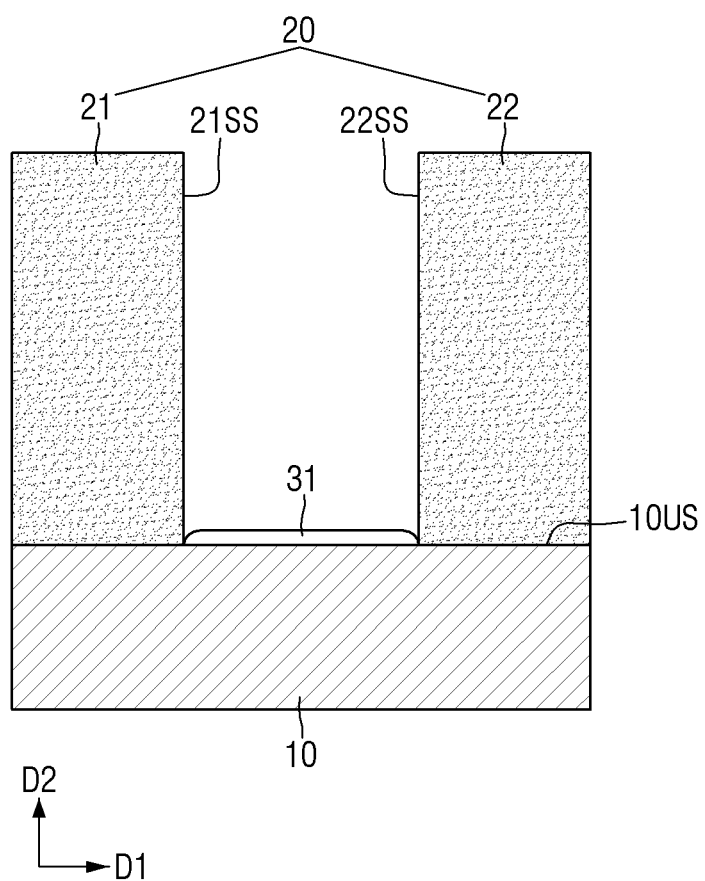

Referring to FIGS. 1 and 4, the inhibitor layer on the second surface may be selectively removed (S300).

The inhibitor layer 30 on the second surfaces 21SS and 22SS may be selectively removed through a heat treatment process. Specifically, the second inhibitor layer 32 may be selectively removed. The first inhibitor layer 31 may not be removed while the second inhibitor layer 32 is being removed. The inhibitor layer 30 on the second surfaces 21SS and 22SS may be removed to expose the second surfaces 21SS and 22SS again.

The heat treatment process may be performed at a temperature of from about 150° C. to about 250° C. The heat treatment process may proceed for a time of from about 1 minute to about 3 minutes. When the inhibitor layer 30 is subjected to the heat treatment process, the first inhibitor layer 31 on the first surface 10US is not removed, and the second inhibitor layer 32 on the second surfaces 21SS and 22SS may be removed. Only the second inhibitor layer 32 may be selectively removed due to the different physical characteristics of the first layer 10 and the second layer 20.

For example, when the heat treatment process is performed, hydrogen cations (H$^+$) are emitted in the second layer 20. The emitted hydrogen cations may react with the second inhibitor layer 32 on the second surfaces 21SS and 22SS. Since the second inhibitor layer 32 includes a material that is dissociated by an acid, the second inhibitor layer 32 may be dissociated when the second inhibitor layer 32 reacts with hydrogen cations. On the other hand, even if the heat treatment process is performed, hydrogen cations are not generated in the first layer 10. Therefore, the first inhibitor layer 31 on the first surface 10US of the first layer 10 does not react with hydrogen cations. As a result, the first inhibitor layer 31 is not removed.

In some embodiments, the upper surface of the first inhibitor layer 31 may not be flat after the second inhibitor layer 32 is removed. For example, the upper surface of the first inhibitor layer 31 may be concave with respect to the first layer 10. As a part of the first inhibitor layer 31 that is in contact with the second surfaces 21SS and 22SS is removed, the upper surface of the first inhibitor layer 31 may not be flat.

Figure 5:
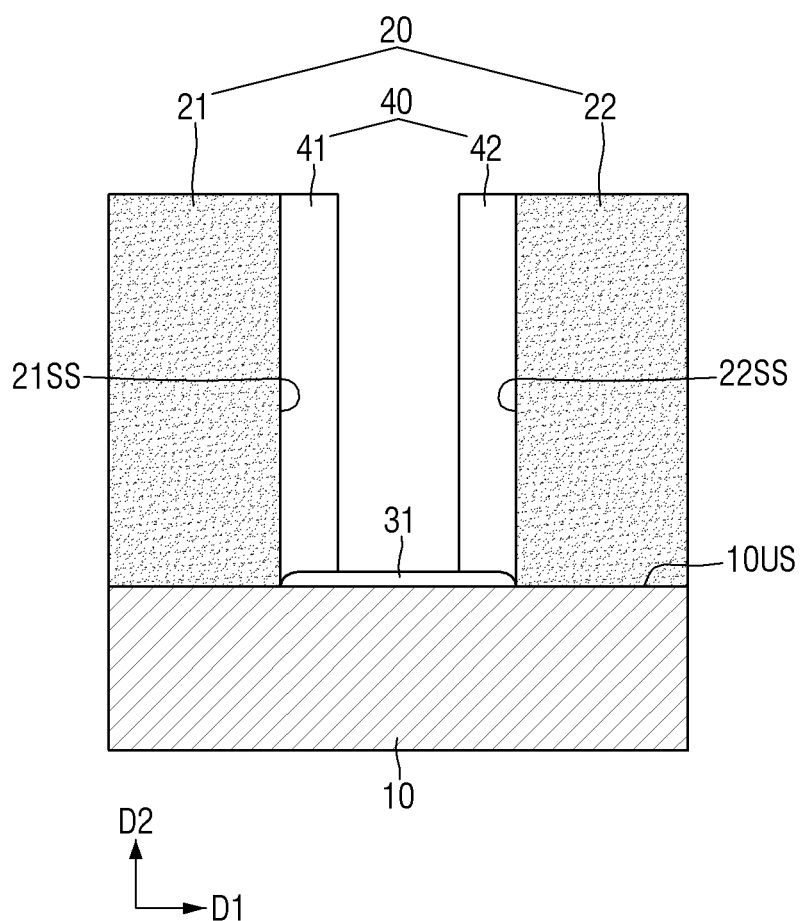

Referring to FIGS. 1 and 5, an interest layer may be deposited on the second surface (S400).

The interest layer 40 may be deposited on the second surfaces 21SS and 22SS. The interest layer 40 may be deposited using, for example, chemical vapor deposition (CVD). The interest layer 40 may include a first interest layer 41 and a second interest layer 42. The first interest layer 41 may be deposited on the first surface 21SS of the first sub-layer 21. The second interest layer 42 may be deposited on the second surface 22SS of the second sub-layer 22.

The interest layer 40 may include an organic material and an inorganic material. For example, the interest layer 40 may include, but is not limited to, silicon oxide (SiO$_2$) or aluminum oxide (AlO).

Figure 6:
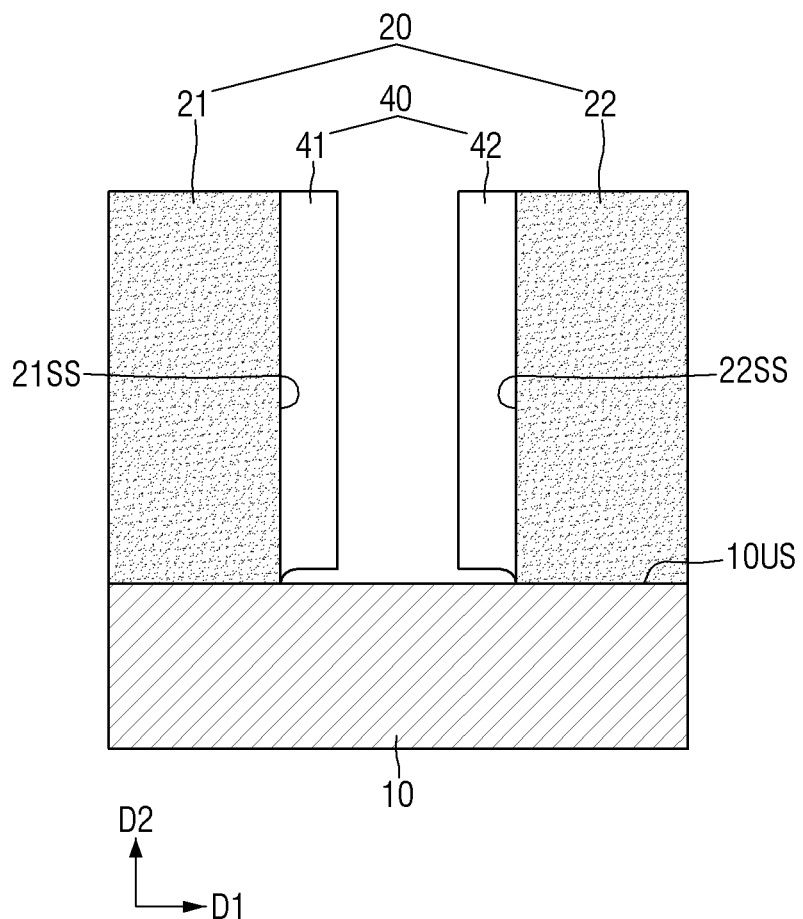

Referring to FIGS. 1 and 6, the inhibitor layer on the first surface may be removed (S500).

For example, the first inhibitor layer 31 on the first surface 10US may be removed. The first inhibitor layer 31 may be removed using an acid treatment process. As mentioned above, the first inhibitor layer 31 includes a material that may be dissociated by acid or hydrogen cation. Therefore, when the hydrogen cation is supplied to the first inhibitor layer 31, the first inhibitor layer 31 may be removed.

In some embodiments, as the first inhibitor layer 31 is removed, an empty space may be generated between the interest layer 40 and the first surface 10US, as illustrated in FIG. 6. That is, the first surface 10US and the interest layer 40 may be spaced apart from each other in the second direction D2. The first interest layer 41 is spaced apart from the first surface 10US in the second direction D2, and the second interest layer 42 is spaced apart from the first surface 10US in the second direction D2, as illustrated in FIG. 6.

As mentioned above, the inhibitor layer 30 may be formed to have a very thin thickness. For example, the thickness of the first inhibitor layer 31 in the second direction D2 may be about 10 angstroms (Å) or less. When the thickness of the first inhibitor layer 31 in the second direction D2 is thin, the empty space between the interest layer 40 and the first surface 10US may be narrowed. In this case, because less etchant penetrates between the empty spaces when performing the subsequent process, a semiconductor device having improved reliability can be manufactured.

Hereinafter, experimental data of the semiconductor manufacturing method according to some embodiments will be described referring to FIGS. 7a to 12. For reference, the first layer (10 of FIG. 2) includes titanium nitride, the second layer (20 of FIG. 2) includes a gap fill insulating material, and the inhibitory layer (30 of FIG. 3) includes hexamethyldisilazane (HMDS).

Figure 7A:
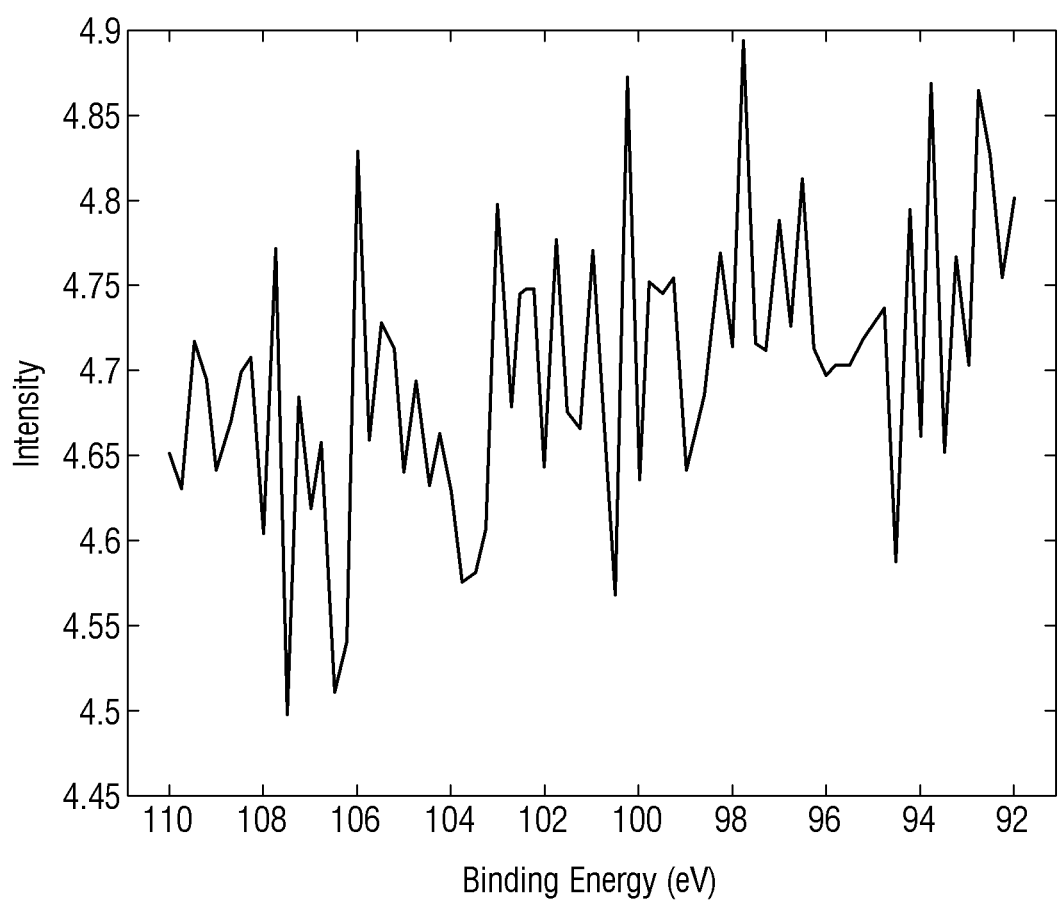
FIGS. 7a and 7b are graphs obtained by analyzing a first surface and a second surface, as defined herein, using X-ray photoelectron spectroscopy (XPS) before treatment of the inhibitor layer.
Figure 7B:
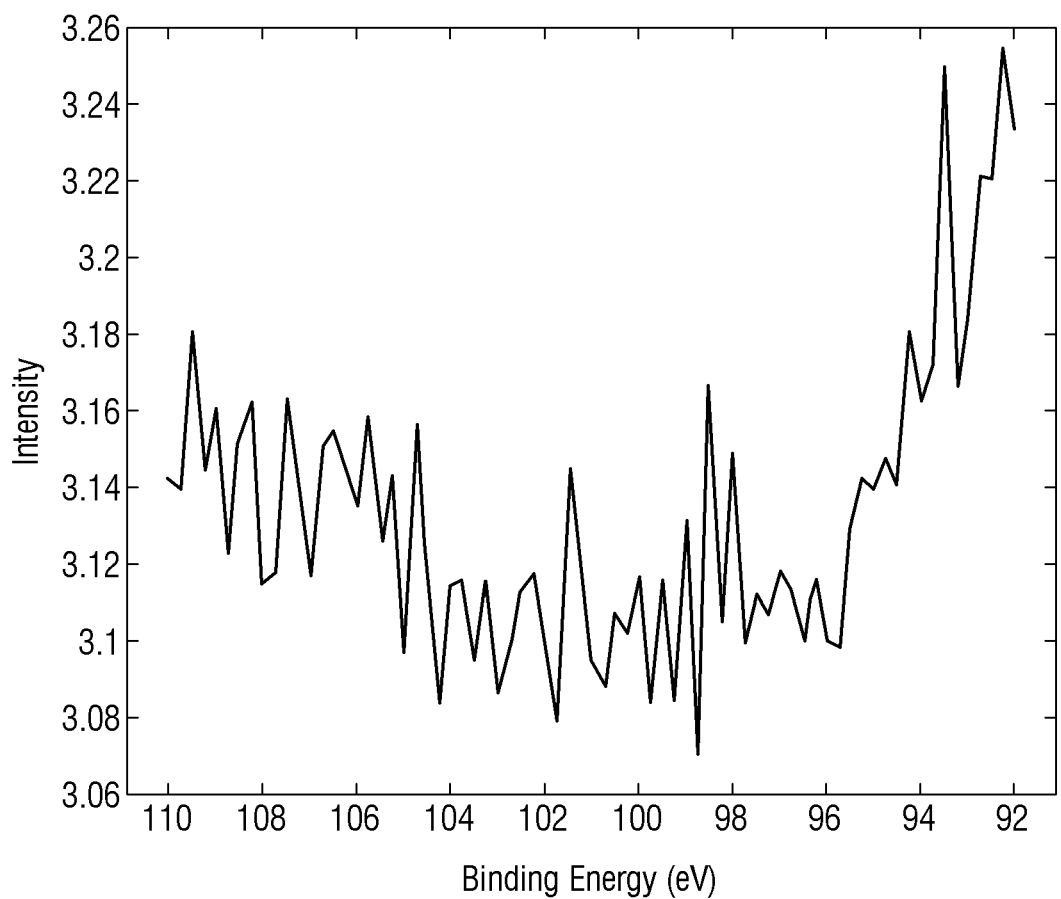

FIGS. 7a and 7b are graphs obtained by analyzing a first surface and a second surface, as defined above, using X-ray photoelectron spectroscopy (XPS) before treatment of the inhibitor layer.

The X-ray photoelectron spectroscopy (XPS) is an analytical technique for analyzing a surface of a sample to be analyzed, and is an analytical method based on the theory of the photoelectric effect. A sample to be analyzed is irradiated with soft X-rays corresponding to energy of tens to thousands of eV having a relatively long wavelength among X-rays. In this case, strongly bonded core level electrons or weakly bonded valance level electrons are emitted from the surface layer atoms forming the assay sample.

The emitted electrons are called photoelectrons. In order for photoelectrons to be emitted, there is a need for a binding energy of electrons and a kinetic energy that may exceed a work function. The binding energy of the electrons of the sample to be analyzed may be derived by measuring the kinetic energy of the emitted photoelectrons. Since the binding energy is an intrinsic energy of the element, the element of the analysis sample may be analyzed.

Referring to FIGS. 2, 7a and 7b, the inhibitor layer is not placed on the first surface 10US and the second surfaces 21SS and 22SS before the inhibitor layer is treated. That is, silicon (Si) does not exist on the first surface 10US and the second surfaces 21SS and 22SS.

In the graphs of FIGS. 7a and 7b, an x-axis represents the binding energy of the element, and a y-axis represents a binding intensity. A strong binding intensity means that the number of bonds corresponding to that energy is large.

The binding energy of silicon is about 100 eV to about 105 eV. Therefore, if the element has a strong binding intensity in the binding energy range of about 100 eV to about 105 eV, it may mean that the sample to be analyzed has a large number of silicon bonds.

In FIGS. 7a and 7b, the binding intensity in the range of about 100 eV to about 106 eV is not strong. This shows that there is no silicon on the first and second surfaces before the inhibitor layer is treated.

Figure 8A:
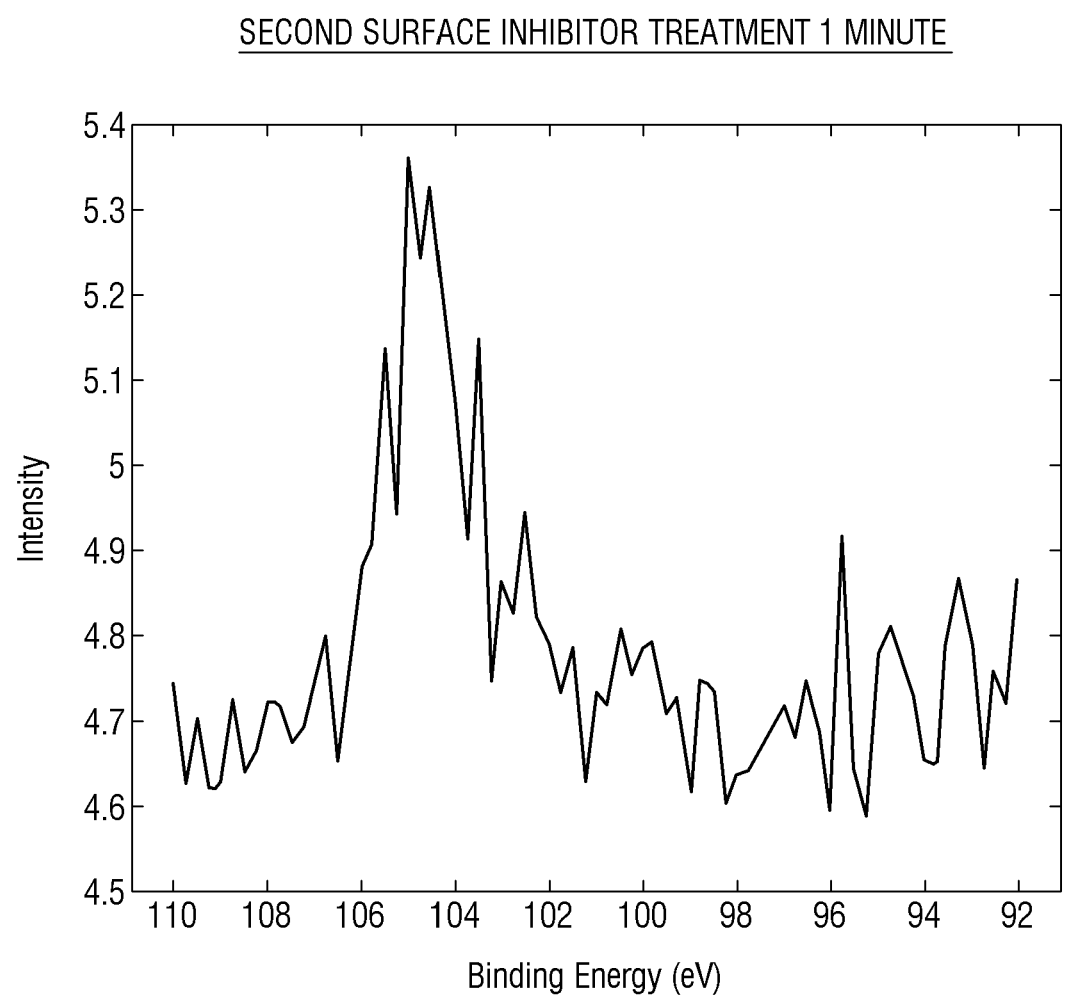
FIGS. 8a and 8b are graphs obtained by analyzing the first surface and the second surface using X-ray photoelectron spectroscopy (XPS) when the inhibitor layer treatment proceeds for 1 minute.
Figure 8B:
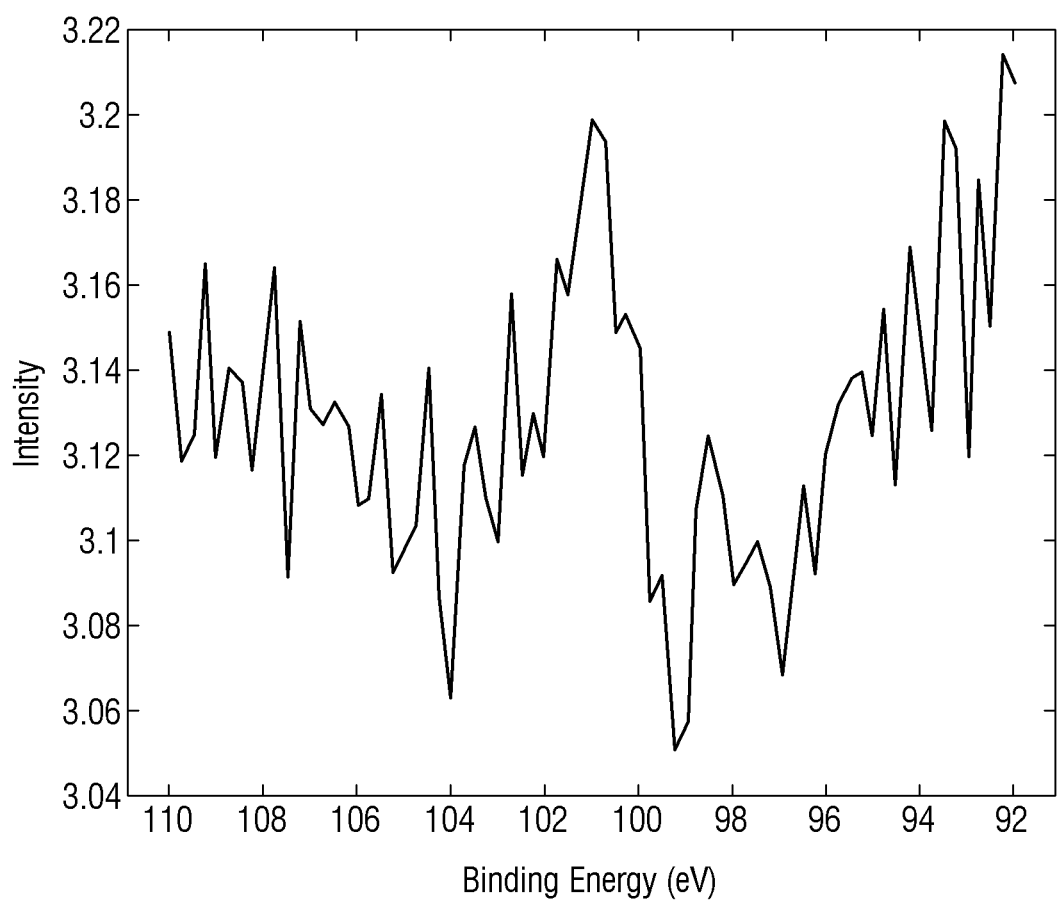

FIGS. 8a and 8b are graphs obtained by analyzing the first surface and the second surface using X-ray photoelectron spectroscopy (XPS) when the inhibitor layer treatment proceeds for 1 minute.

Referring to FIGS. 3 and 8a, when the inhibitor layer treatment proceeds for 1 minute, the inhibitor layer 30 is formed on the second surfaces 21SS and 22SS. The second inhibitor layer 32 is formed on the second surfaces 21SS and 22SS.

In FIG. 8a, the binding intensity is strongly exhibited at a binding energy of about 105 eV. That is, it may be understood that when performing the inhibitor layer treatment on the second surfaces 21SS and 22SS for 1 minute, the number of silicon bonds on the second surfaces 21SS and 22SS increases.

Referring to FIGS. 3 and 8b, the inhibitor layer 30 is formed on the first surface 10US when the inhibitor layer treatment proceeds for 1 minute. The first inhibitor layer 31 is formed on the first surface 10US.

In FIG. 8b, the binding intensity is strongly exhibited at a binding energy of about 101 eV. That is, it may be understood that the number of silicon bonds on the first surface 10US increases when performing the inhibitor layer treatment on the first surface 10US for 1 minute.

Figure 9A:
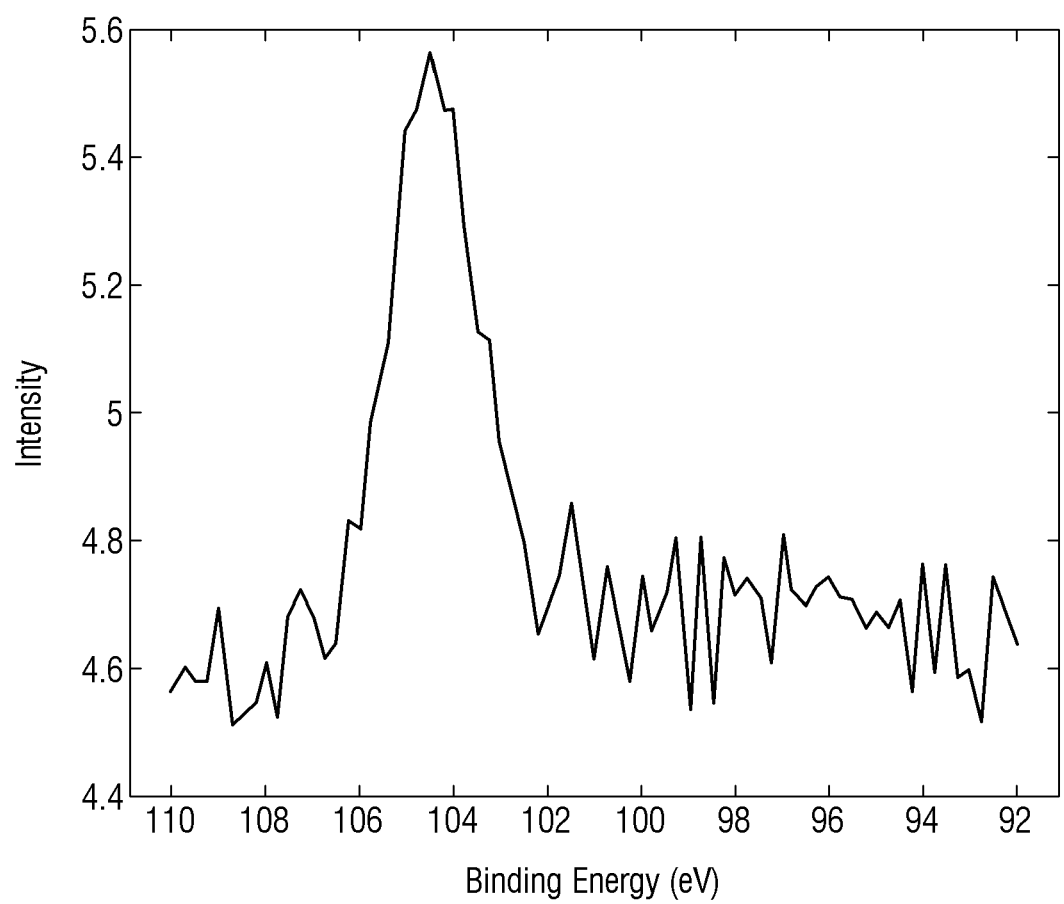
FIGS. 9a and 9b are graphs obtained by analyzing the first surface and the second surface using X-ray photoelectron spectroscopy (XPS) when the inhibitor layer treatment proceeds for 3 minutes.
Figure 9B:
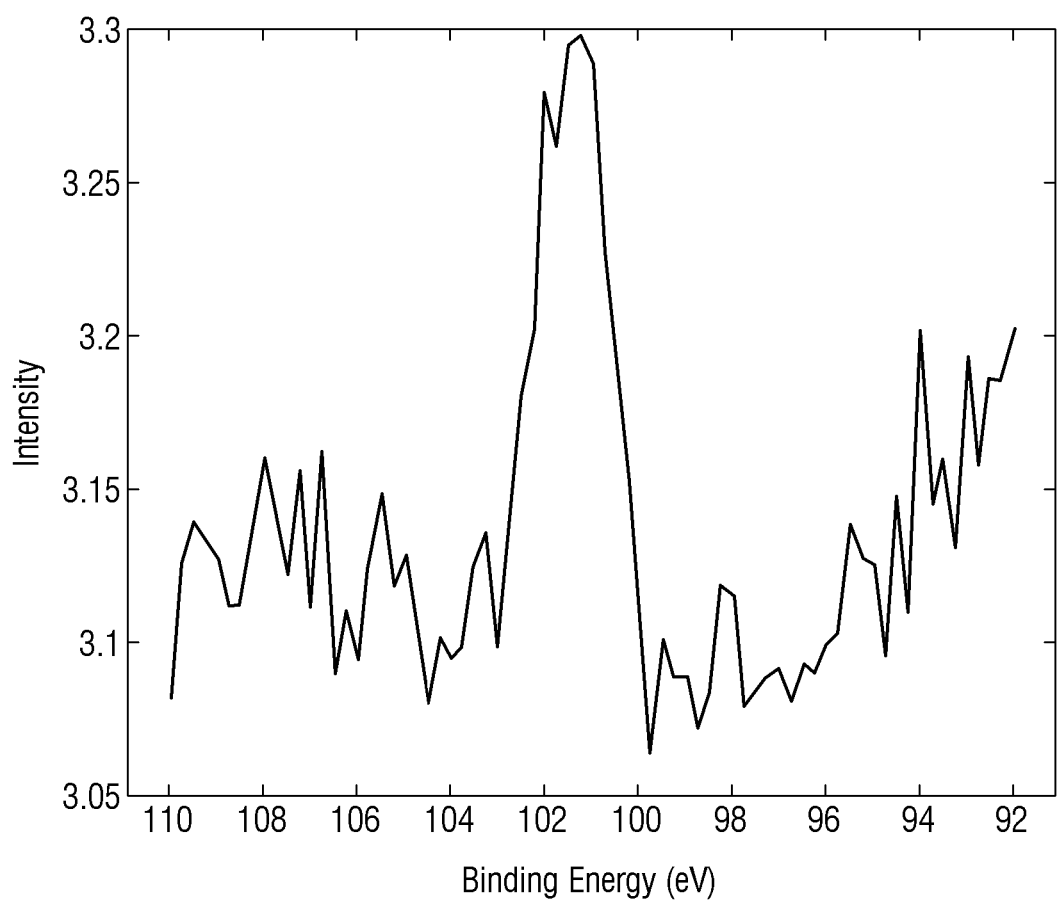

FIGS. 9a and 9b are graphs obtained by analyzing the first surface and the second surface using X-ray photoelectron spectroscopy (XPS) when the inhibitor layer treatment proceeds for 3 minutes.

Referring to FIGS. 8a and 9a, it may be understood that the binding intensity at a binding energy of about 105 eV when performing the inhibitor layer treatment on the second surface for 3 minutes increases compared to the binding intensity at the binding energy of about 105 eV when performing the inhibitor layer treatment on the second surface for 1 minute.

Specifically, when the inhibitor layer treatment proceeds for 1 minute, the binding intensity at the binding energy of 105 eV is about 5.35, and when the inhibitor layer treatment proceeds for 3 minutes, the binding intensity at the binding energy of 105 eV is about 5.6. That is, the longer the inhibitor layer treatment time is, the greater the number of silicon bonds on the second surface is.

Referring to FIGS. 8b and 9b, it may be understood that the binding intensity at a binding energy of about 101 eV when performing the inhibitor layer treatment on the first surface for 3 minutes increases compared to the binding intensity at the binding energy of about 101 eV when performing the inhibitor layer treatment on the first surface for 1 minute.

Specifically, when the inhibitor layer treatment proceeds for 1 minute, the binding intensity at the binding energy of 101 eV is about 3.2, and when the inhibitor layer treatment proceeds for 3 minutes, the binding intensity at the binding energy of 101 eV is about 3.3. That is, the longer the inhibitor layer treatment time is, the larger the number of silicon bonds on the first surface is.

Figure 10A:
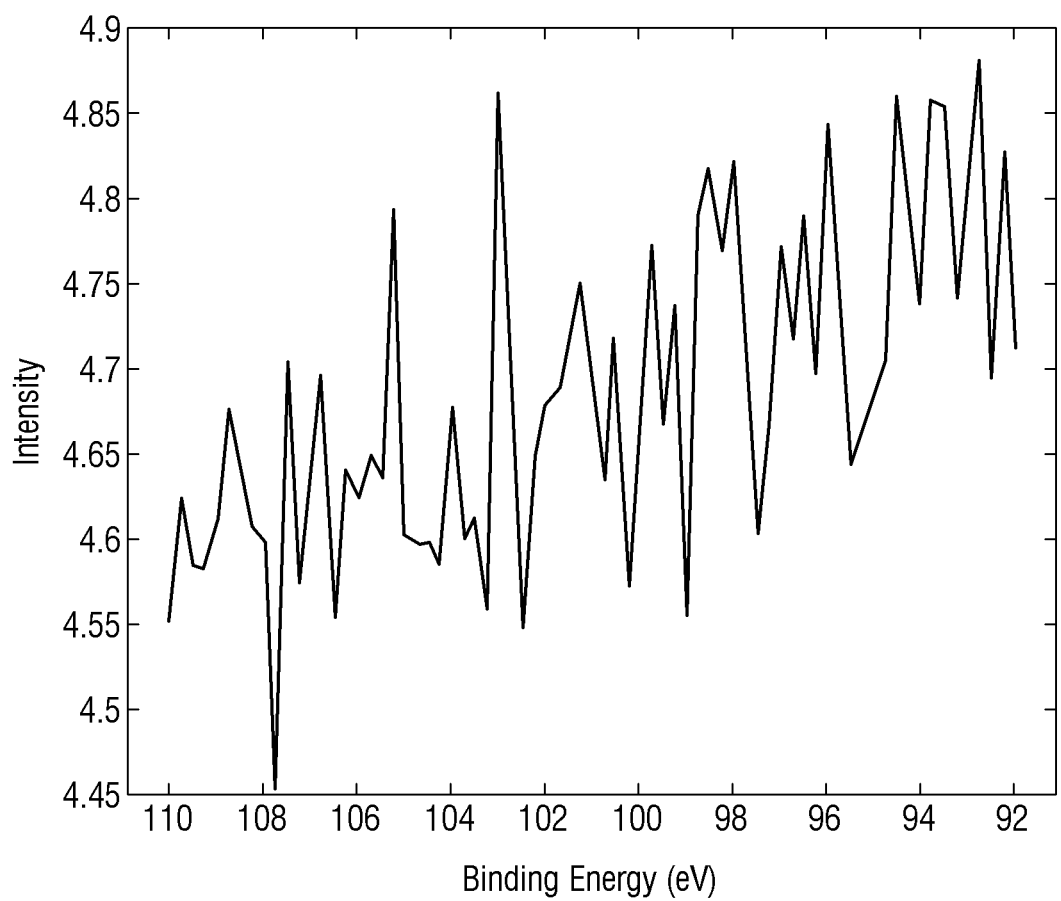
FIGS. 10a and 10b are graphs obtained by analyzing the first surface and the second surface using X-ray photoelectron spectroscopy (XPS) after the heat treatment process proceeds for 1 minute.
Figure 10B:
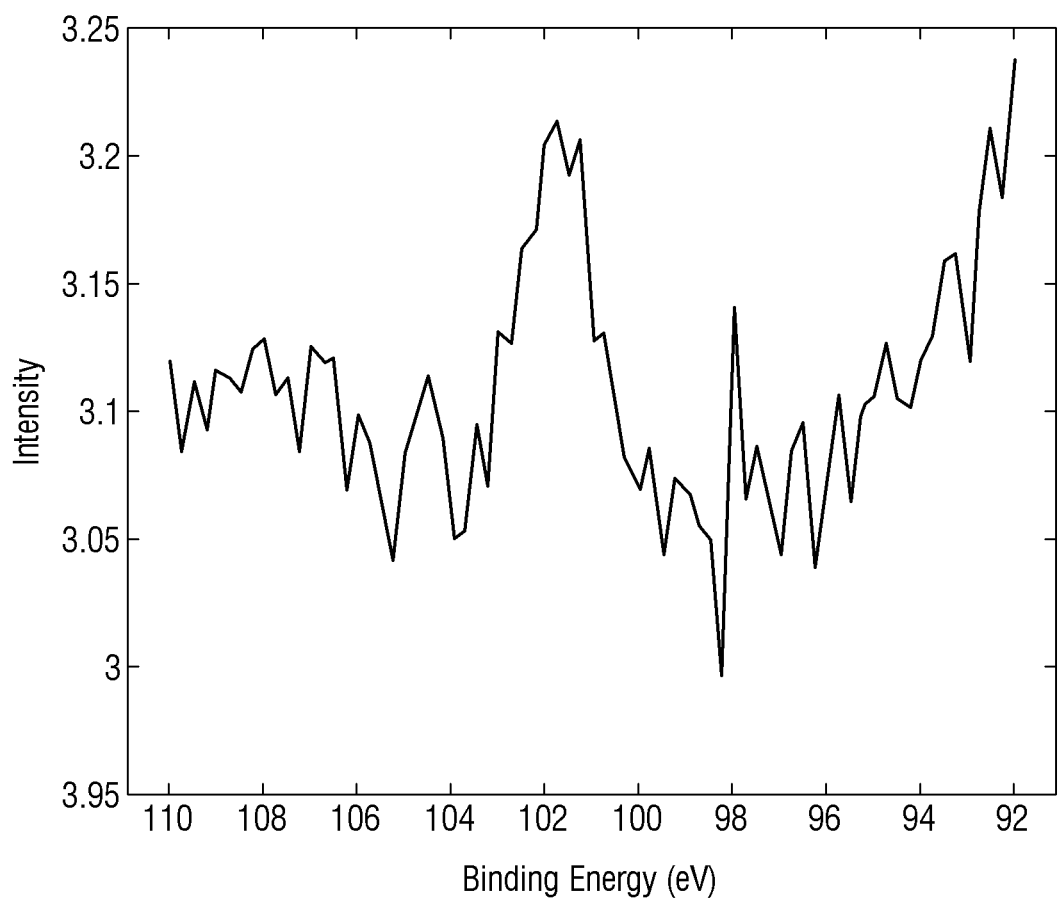

FIGS. 10a and 10b are graphs obtained by analyzing the first surface and the second surface using X-ray photoelectron spectroscopy (XPS) after the heat treatment process proceeds for 1 minute.

Referring to FIG. 10a, when the heat treatment process proceeds on the second surface for 1 minute, the binding intensity at a binding energy of about 105 eV decreases. That is, when the heat treatment process on the second surface occurs for 1 minute, the inhibitor layer on the second surface is removed.

On the other hand, referring to FIG. 10b, even if the heat treatment process on the first surface occurs for 1 minute, the binding intensity at the binding energy of 101 eV does not decrease. That is, even if the heat treatment process proceeds on the first surface for 1 minute, the inhibitor layer on the first surface is not removed.

In this way, when the heat treatment process is performed, the inhibitor layer on the first surface is not removed, and the inhibitor layer on the second surface may be selectively removed. As described above, this may be caused by a difference in physical properties in which when performing the heat treatment process, hydrogen cations are generated in the second layer, but hydrogen cations are not generated in the first layer. That is, the inhibitor layer on the second surface may be selectively removed by the difference in physical properties between the first layer and the second layer.

Figure 11A:
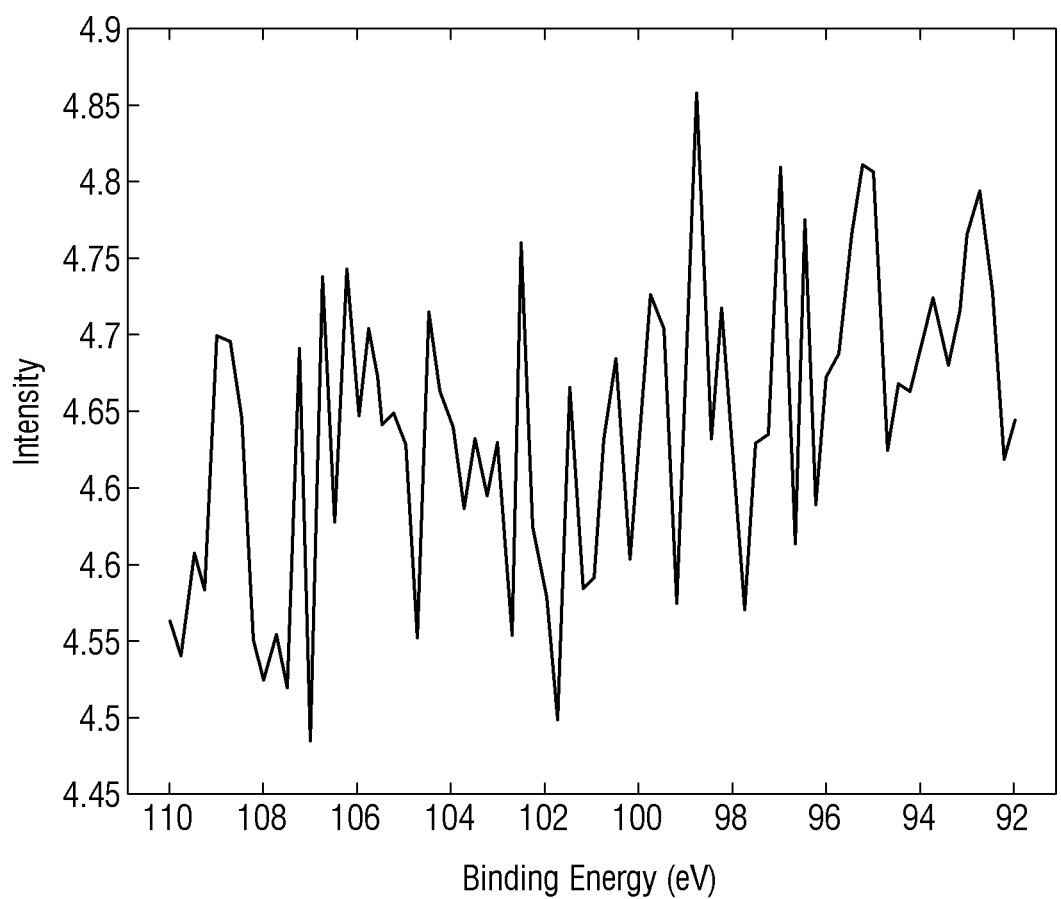
FIGS. 11a and 11b are graphs obtained by analyzing the first surface and the second surface using X-ray photoelectron spectroscopy (XPS) after the heat treatment process proceeds for 4 minutes.
Figure 11B:
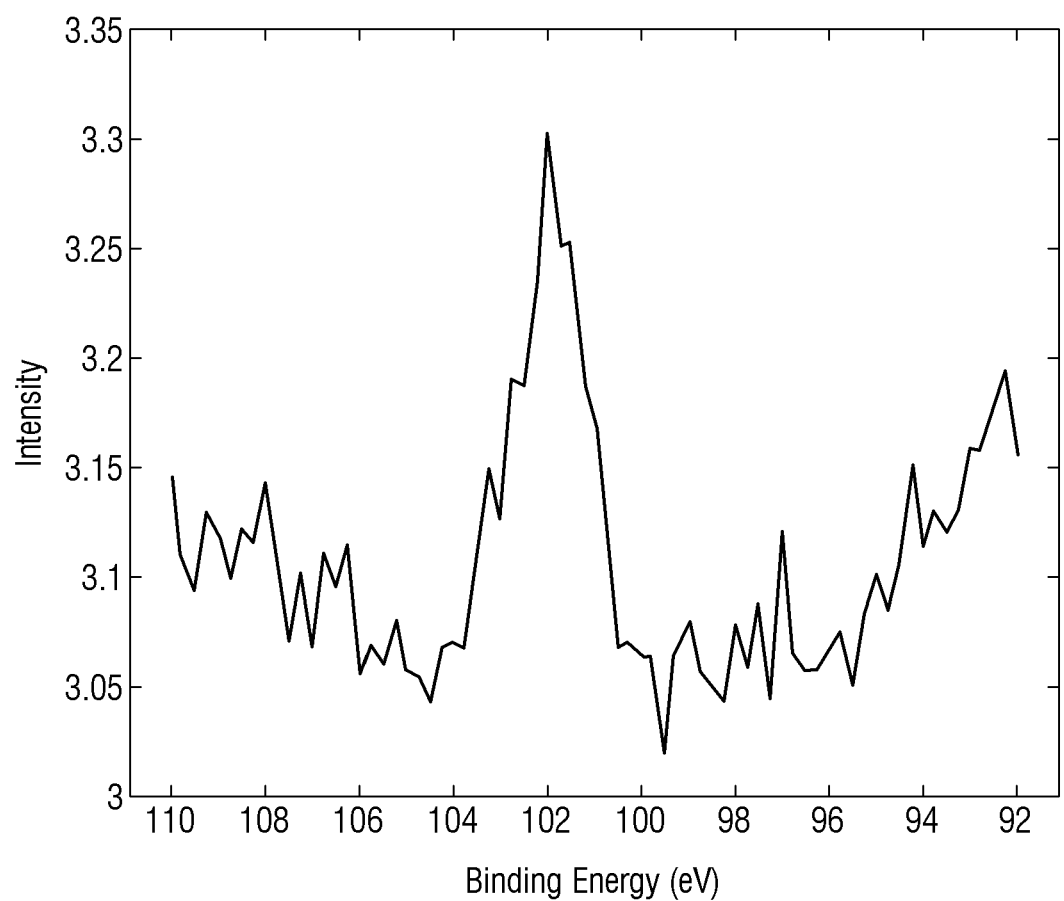

FIGS. 11a and 11b are graphs obtained by analyzing the first surface and the second surface using X-ray photoelectron spectroscopy (XPS) after the heat treatment process proceeds for 4 minutes.

Referring to FIG. 11a, when the heat treatment process on the second surface occurs for 4 minutes, the binding intensity at the binding energy of 105 eV is weak. That is, most of the inhibitor layer on the second surface may be removed.

Referring to FIG. 11b, even if the heat treatment process on the first surface occurs for 4 minutes, the binding intensity at the binding energy of 101 eV is not weakened. That is, even if the heat treatment process on the first surface occurs for 4 minutes, the inhibitor layer on the first surface is not removed.

In some embodiments, the heat treatment process may occur for about 1 to 4 minutes to selectively remove the inhibitor layer on the second surface.

Figure 12:
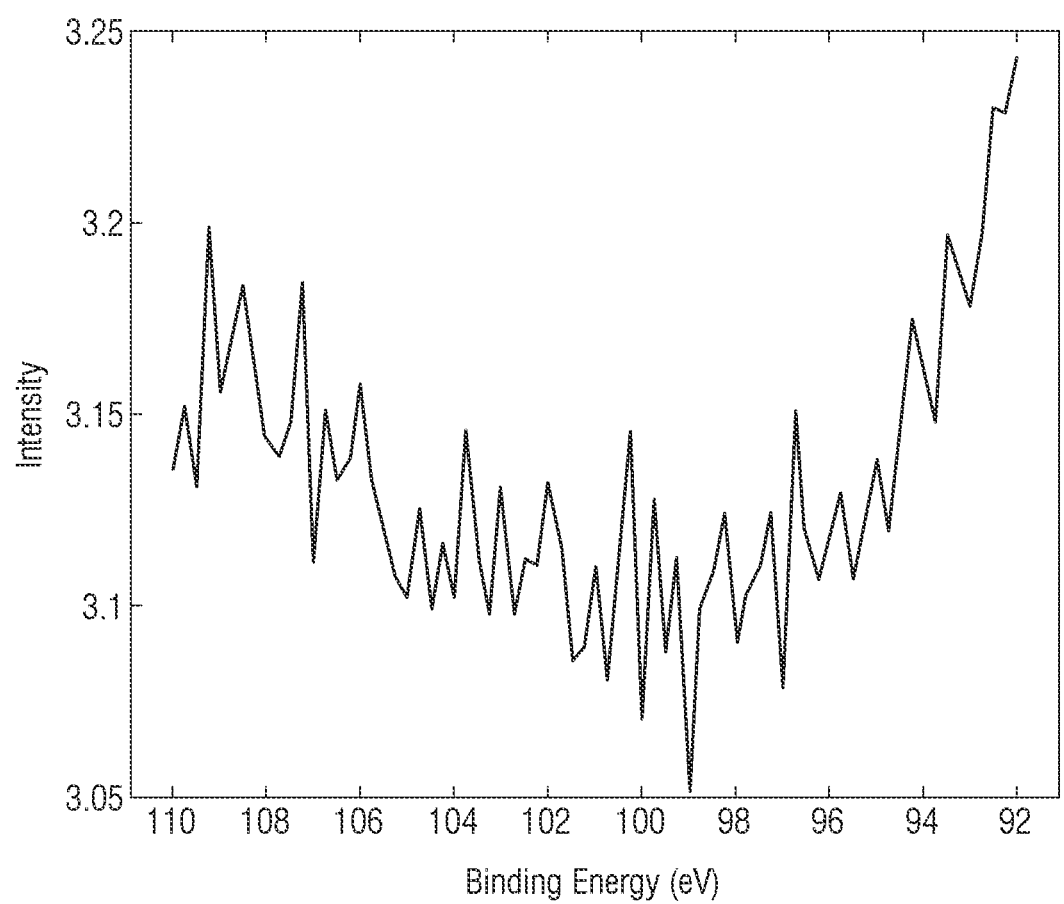
FIG. 12 is a graph obtained by analyzing the first surface using X-ray photoelectron spectroscopy (XPS) when performing the acid treatment.

FIG. 12 is a graph obtained by analyzing the first surface using X-ray photoelectron spectroscopy (XPS) when performing the acid treatment.

Referring to FIG. 12, when the acid treatment proceeds on the first surface, the binding intensity at a binding energy of about 101 eV is weakened. That is, when the acid treatment proceeds on the first surface, the inhibitor layer on the first surface may be removed.

As mentioned above, the inhibitor layer includes materials that are dissociated by acid or hydrogen cations. For example, the inhibitor layer includes HMDS. When supplying acid or hydrogen cation to HMDS, HMDS may be dissociated.

Hereinafter, a method for manufacturing a semiconductor device according to some embodiments will be described. In the drawings relating to the semiconductor device to be described below, a transistor including nanowire or nanosheet, MBCFET (Multi-Bridge Channel Field Effect Transistor) are shown as an example, but the present inventive concept is not limited thereto.

A semiconductor device according to some embodiments may, of course, include a fin-type transistor (FinFET) including a channel region of a fin-type pattern shape, a tunneling transistor (tunneling FET) or a three-dimensional (3D) transistor. The semiconductor device according to some embodiments may, of course, include a planar transistor. In addition, the technical idea of the present disclosure may be applied to a transistor based on two-dimensional material (2D material based FETs) and a heterostructure thereof.

Further, the semiconductor device according to some embodiments may also include a bipolar junction transistor, a laterally diffused metal oxide semiconductor (LDMOS), or the like.

FIGS. 13 to 26 are intermediate views for explaining methods for manufacturing semiconductor devices according to some embodiments of the present inventive concept.

Figure 13:
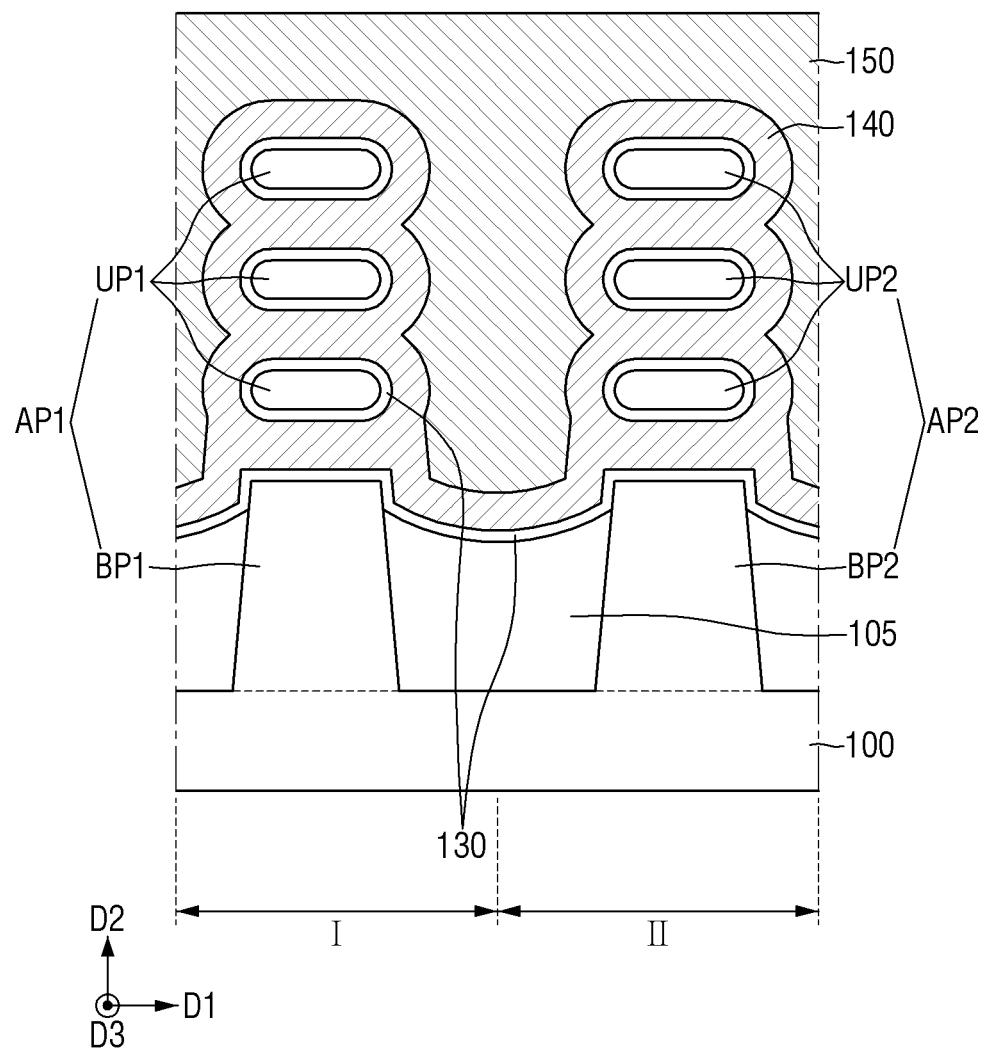
FIGS. 13 to 26 are intermediate views for explaining methods for manufacturing semiconductor devices according to some example embodiments.

Referring to FIG. 13, a substrate 100 is provided. The substrate 100 may include a first region I and a second region II. The first region I and the second region II may be regions adjacent to each other or may be regions spaced apart from each other.

The substrate 100 may be a silicon substrate or an SOI (silicon-on-insulator). In contrast, the substrate 100 may include, but is not limited to, silicon germanium, SGOI (silicon germanium on insulator), indium antimonide, lead tellurium compounds, indium arsenide, indium phosphide, gallium arsenide or gallium antimonide.

Although not shown, the substrate 100 may include active regions and a field region. The field region may be formed between the active regions. That is, the active region may be separated by the field region. Alternatively, an element isolation film may be placed around the active region. A portion in which the element isolation film is placed may be the field region.

For example, a portion in which a channel region of a transistor, which may be an example of the semiconductor device, is formed may be the active region, and a portion that divides the channel region of the transistor formed in the active region may be a field region. Alternatively, the active region may be a portion in which nanosheets or nanowires used as the channel region of the transistor are formed, and the field region may be a region in which the nanosheets or nanowires used as the channel region are not formed.

In some embodiments, one of the first region I and the second region II may be a PMOS formation region and the other thereof may be an NMOS formation region. In another embodiment, the first region I and the second region II may both be the PMOS formation region. In another embodiment, the first region I and the second region II may both be the NMOS formation region.

A first active pattern AP1 may be formed on the substrate 100 of the first region I. A second active pattern AP2 may be formed on the substrate of the second region II. The portion in which the first active pattern AP1 and the second active pattern AP2 are formed may be the active region.

The first active pattern AP1 may include a first lower pattern BP1 and a plurality of first sheet patterns UP1. The second active pattern AP2 may include a second lower pattern BP2 and a plurality of second sheet patterns UP2.

The first lower pattern BP1 and the second lower pattern BP2 may protrude from the substrate 100 in the second direction D2 and extend long in a third direction D3. The first lower pattern BP1 and the second lower pattern BP2 may be spaced apart from each other in the first direction D1. The first direction D1, the second direction D2, and the third direction D3 may intersect each other. The first direction D1, the second direction D2, and the third direction D3 may be substantially perpendicular to each other.

The first sheet pattern UP1 may be formed on the first lower pattern BP1. The first sheet pattern UP1 may be spaced apart from the first lower pattern BP1 in the second direction D2. The first sheet pattern UP1 may be at least one or more. Each first sheet pattern UP1 may be spaced apart from each other in the second direction D2.

The second sheet pattern UP2 may be formed on the second lower pattern BP2. The second sheet pattern UP2 may be spaced apart from the second lower pattern BP2 in the second direction D2. The second sheet pattern UP2 may be at least one or more. Each of the second sheet patterns UP2 may be spaced apart from each other in the second direction D2.

Although the three first sheet patterns UP1 and second sheet patterns UP2 are each shown, this is only for convenience of explanation, and the number thereof is not limited thereto.

Each of the first and second active patterns AP1 and AP2 may be a part of the substrate 100, and may include an epitaxial layer that is grown from the substrate 100. The first and second active patterns AP1 and AP2 may include, for example, silicon or germanium, which are elemental semiconductor materials. Further, the first and second active patterns AP1 and AP2 may include a compound semiconductor, and may include, for example, a group IV-IV compound semiconductor or a group III-V compound semiconductor. The group IV-IV compound semiconductor may include, for example, a binary compound or a ternary compound including at least two or more of carbon (C), silicon (Si), germanium (Ge) and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

In some embodiments, the first and second active patterns AP1 and AP2 may include the same material. In other embodiments, the first and second active patterns AP1 and AP2 may include different materials from each other.

A field insulating film 105 may be formed between the first lower pattern BP1 and the second lower pattern BP2. The portion in which the field insulating film 105 is formed may be the field region. The first lower pattern BP1 and the second lower pattern BP2 may be interposed between the field insulating films 105. The field insulating film 105 may be formed on a part of the side surface of the first lower pattern BP1 and a part of the side surface of the second lower pattern BP2. The first and second lower patterns BP1 and BP2 may each protrude upward from the upper surface of the field insulating film 105. The field insulating film 105 may include, for example, an oxide film, a nitride film, an oxynitride film, or a combination film thereof.

A gate insulating film 130 may be formed. The gate insulating film 130 may be formed on the upper surface of the field insulating film 105, the upper surface and a part of the side surface of the first lower pattern BP1, the upper surface and a part of the side surface of the second lower pattern BP2, the first sheet pattern UP1 and the second sheet pattern UP2. The gate insulating film 130 may wrap around the first sheet pattern UP1 and the second sheet pattern UP2.

The gate insulating film 130 may include silicon oxide, silicon oxynitride, silicon nitride, or a high dielectric constant material having a higher dielectric constant than that of silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The semiconductor device according to some embodiments may include an NC (Negative Capacitance) FET that uses a negative capacitor. For example, the gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitance may be greater than an absolute value of each of the individual capacitances, while having a positive value.

When the ferroelectric material film having the negative capacitance and the paraelectric material film having the positive capacitance are connected in series, the overall capacitance value of the ferroelectric material film and the paraelectric material film connected in series may increase. By the use of the increased overall capacitance value, a transistor including the ferroelectric material film may have a subthreshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include about 3 to about 8 at % (atomic %) aluminum. Here, a ratio of the dopant may be a ratio of aluminum to the sum of hafnium and aluminum.

When the dopant is silicon (Si), the ferroelectric material film may include about 2 to about 10 at % silicon. When the dopant is yttrium (Y), the ferroelectric material film may include about 2 to about 10 at % yttrium. When the dopant is gadolinium (Gd), the ferroelectric material film may include about 1 to about 7 at % gadolinium. When the dopant is zirconium (Zr), the ferroelectric material film may include about 50 to about 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but is not limited to, about 0.5 to about 10 nm. Since a critical thickness that exhibits the ferroelectric properties may vary for each ferroelectric material, the thickness of the ferroelectric material film may vary depending on the ferroelectric material.

In some embodiments, the gate insulating film 130 may include one ferroelectric material film. In another embodiment, the gate insulating film 130 may include a plurality of ferroelectric material films spaced apart from each other. The gate insulating film 130 may have a stacked film structure in which the plurality of ferroelectric material films and the plurality of paraelectric material films are alternately stacked.

A work function metal layer 140 may be formed on the substrate 100. The work function metal layer 140 may be formed on the gate insulating film 130. The work function metal layer 140 may wrap around the first and second sheet patterns UP1 and UP2. The work function metal layer 140 may include titanium nitride (TiN), an organic polymer, and a combination thereof. The work function metal layer 140 may include, for example, but is not limited to, a titanium nitride layer.

A protective layer 150 may be formed on the work function metal layer 140. The protective layer 150 may cover the work function metal layer 140. The material included in the protective layer 150 may be the same as the material included in the work function metal layer 140. For example, the protective layer 150 may include, but is not limited to, a titanium nitride film.

Figure 14:
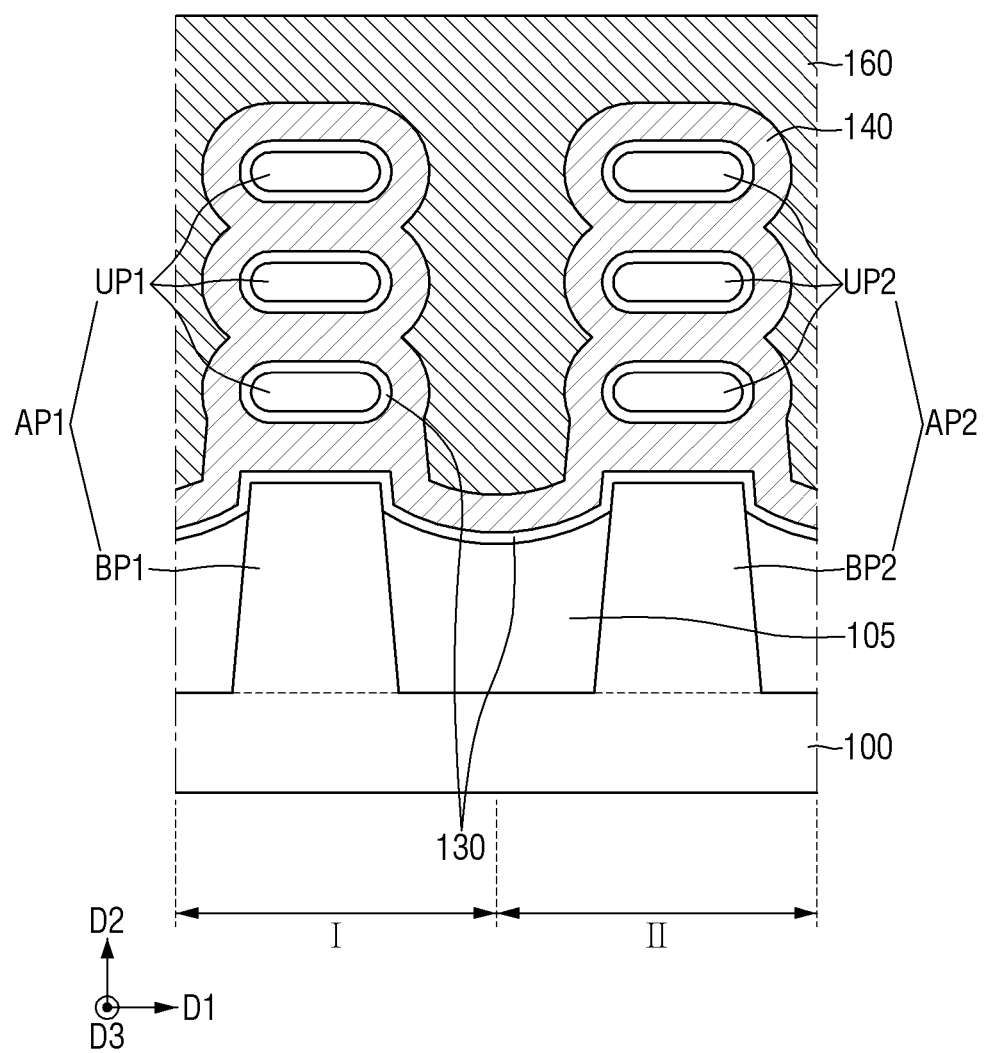

Referring to FIG. 14, a sacrificial layer 160 may be formed.

A gap fill insulating material may be deposited on the protective layer 150. The protective layer 150 and the gap fill insulating material may be combined to form the sacrificial layer 160. The sacrificial layer 160 may be, for example, a material whose surface includes an acid precursor. When a stimulus such as heat, light, or electromagnetic wave is applied to the sacrificial layer 160, the sacrificial layer 160 may emit acid or hydrogen cation.

Figure 15:
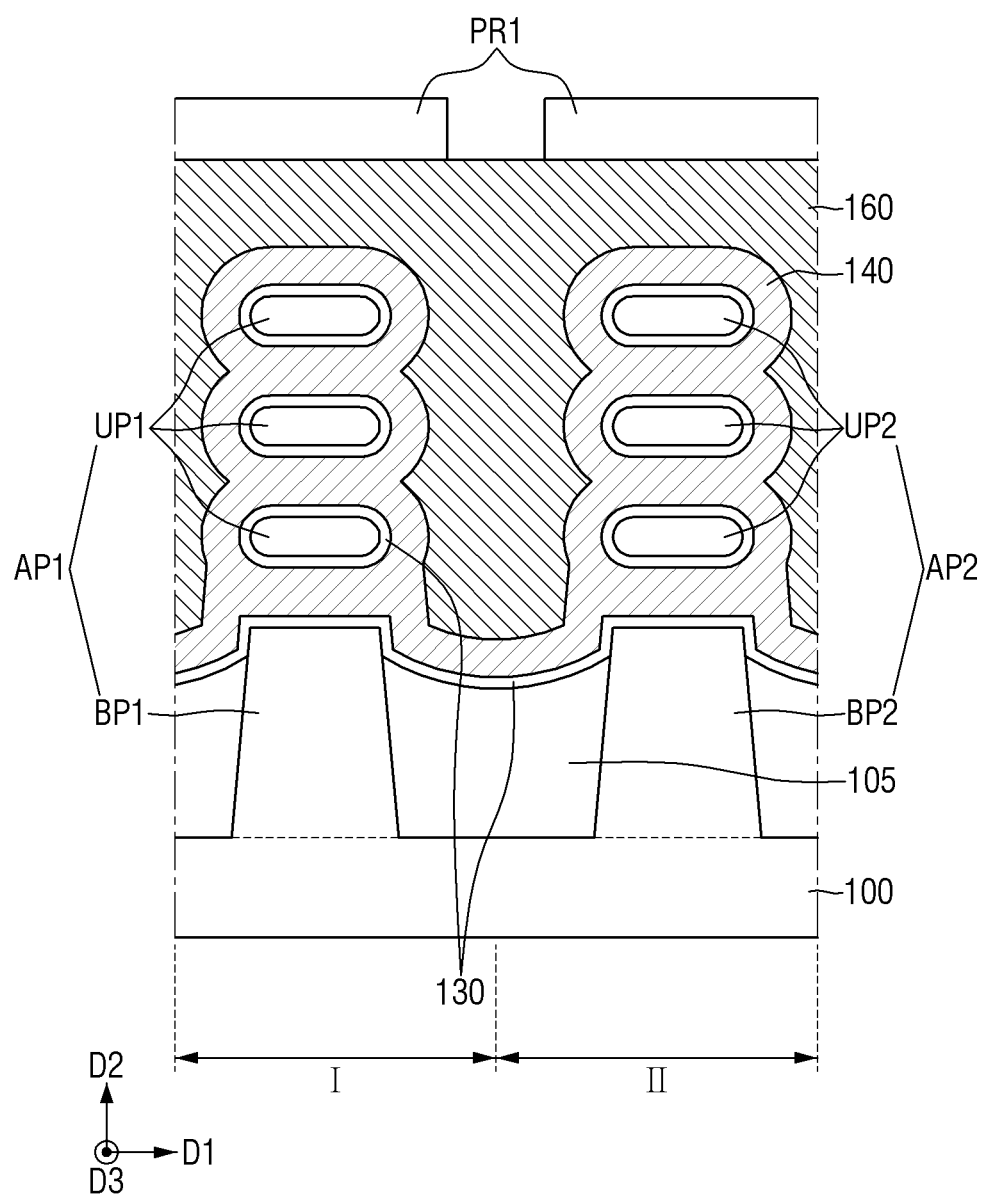

Referring to FIG. 15, a first photoresist PR1 may be formed on the sacrificial layer 160.

Figure 16:
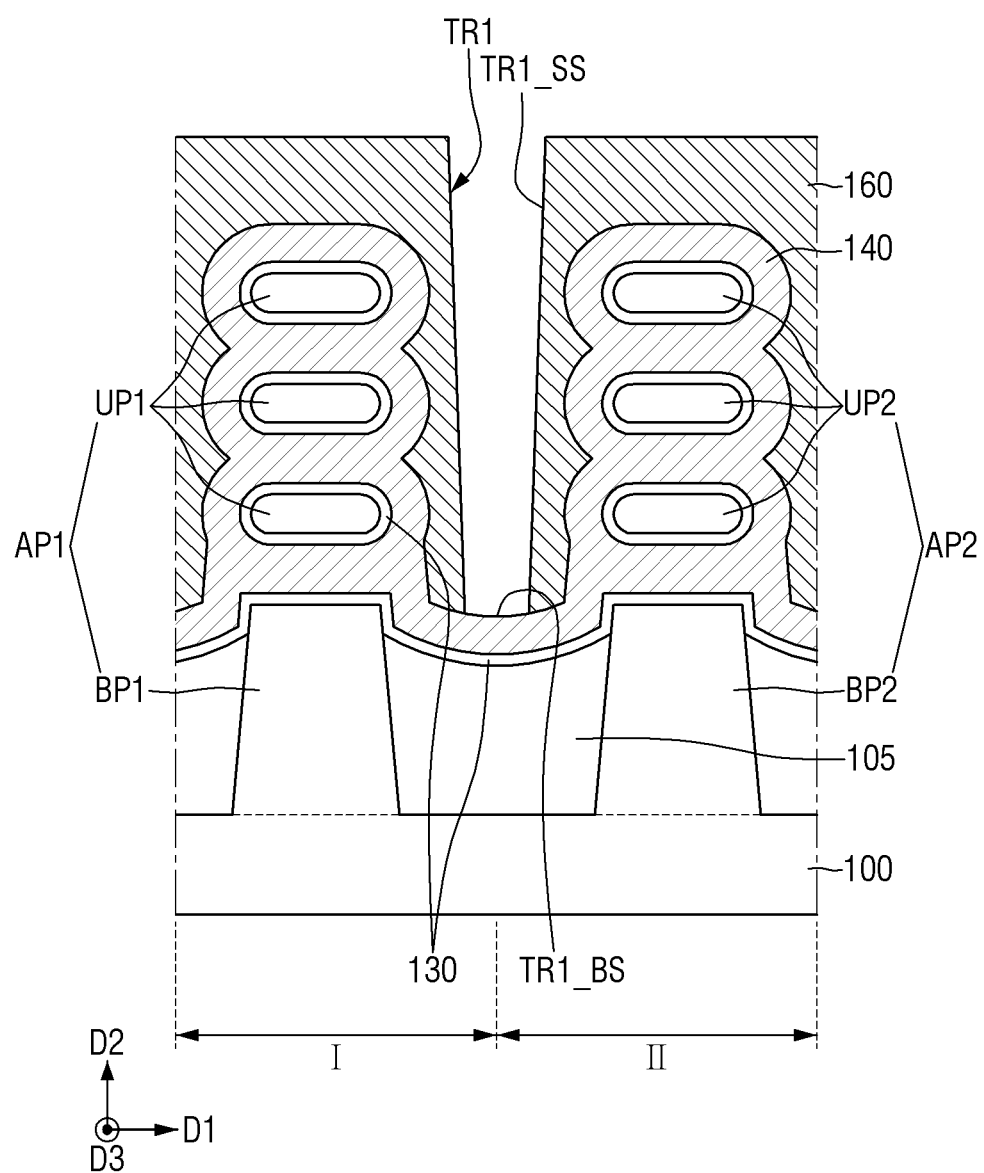

The first photoresist PR1 may have an opening that schematically defines a position of a first trench (TR1 of FIG. 16). The first photoresist PR1 may be formed of at least one of a photoresist film, an ACL (Amorphous Carbon Layer), a SOH (Spin on Hardmask), an SOC (Spin on Carbon), and a silicon nitride film.

Referring to FIG. 16, the first trench TR1 may be formed using the first photoresist PR1 as a mask.

A part of the sacrificial layer 160 may be removed through a dry etching process. The sacrificial layer 160 is etched in the second direction D2 to form the first trench TR1. Although the first trench TR1 is shown as being formed at a boundary between the first region I and the second region II, this is only for convenience of explanation, and the embodiment is not limited thereto.

The first trench TR1 may include a side surface TR1_SS and a bottom surface TR1_BS of the first trench TR1. The first trench TR1 may expose the surface of the work function metal layer 140 and the surface of the sacrificial layer 160. The bottom surface TR1_BS of the first trench TR1 exposes the surface of the work function metal layer 140. The side surface TR1_SS of the first trench TR1 exposes the surface of the sacrificial layer 160.

Figure 17:
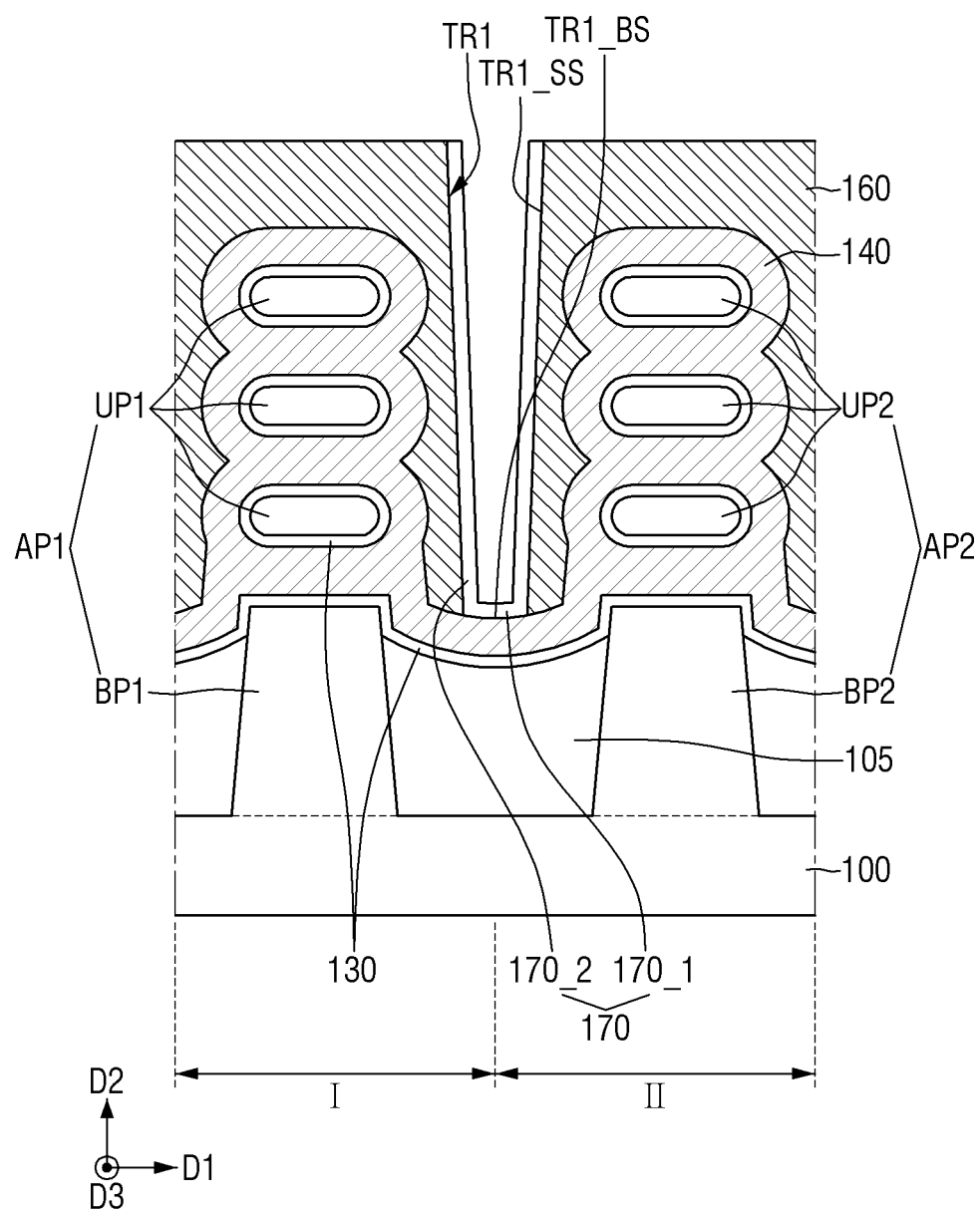

Referring to FIG. 17, an inhibitor layer 170 may be formed along the bottom surface TR1_BS and the side surface TR1_SS of the first trench TR1. The inhibitor layer 170 may be conformally formed along the bottom surface TR1_BS and the side surface TR1_SS of the first trench TR1.

The inhibitor layer 170 may be formed under temperature conditions of from about 80° C. to about 240° C. The formation time of the inhibitor layer 170 may take a minimum of about 1 minute to a maximum of about 20 minutes. However, the technical idea of the inventive concept is not limited thereto, and the temperature for forming the inhibitor layer 170 and the time for forming the inhibitor layer 170 may vary depending on the process conditions and circumstances.

The inhibitor layer 170 may include a first portion 170_1 and a second portion 170_2. The first portion 170_1 of the inhibitor layer 170 may be formed along the bottom surface TR1_BS of the first trench TR1. The first portion 170_1 of the inhibitor layer 170 may be formed on the surface of the work function metal layer 140. The second portion 170_2 of the inhibitor layer 170 may be formed along the side surface TR1_SS of the first trench TR1. The second portion 170_2 of the inhibitor layer 170 may be formed on the surface of the sacrificial layer 160.

The inhibitor layer 170 may include a material that is dissociated by acid or hydrogen cation. The inhibitor layer 170 may include a protecting group that is dissociated by acid. The inhibitor layer 170 may include, but is not limited to, a trimethylsilyl group.

The inhibitor layer 170 may include, for example, but is not limited to, at least one of, hexamethyldisilazane (HMDS), trimethylsilyldiethylamine, bis(N,N-dimethylamino)dimethylsilane, trimethylsilyldimethylamine, bis(trimethylsilyl)hydrazine, and trimethylchlorosilane.

The inhibitor layer 170 may be formed to have a very thin thickness. For example, a thickness of the inhibitor layer 170 may be about 20 angstroms (Å) or less. Preferably, the thickness of the inhibitor layer 170 may be about 10 angstroms (Å) or less. That is, a width of the first portion 170_1 of the inhibitor layer 170 in the second direction D2 may be about 10 angstroms (Å) or less. The width of the second portion 170_2 of the inhibitor layer 170 in the first direction D1 may be about 10 angstroms (Å) or less.

Figure 18:
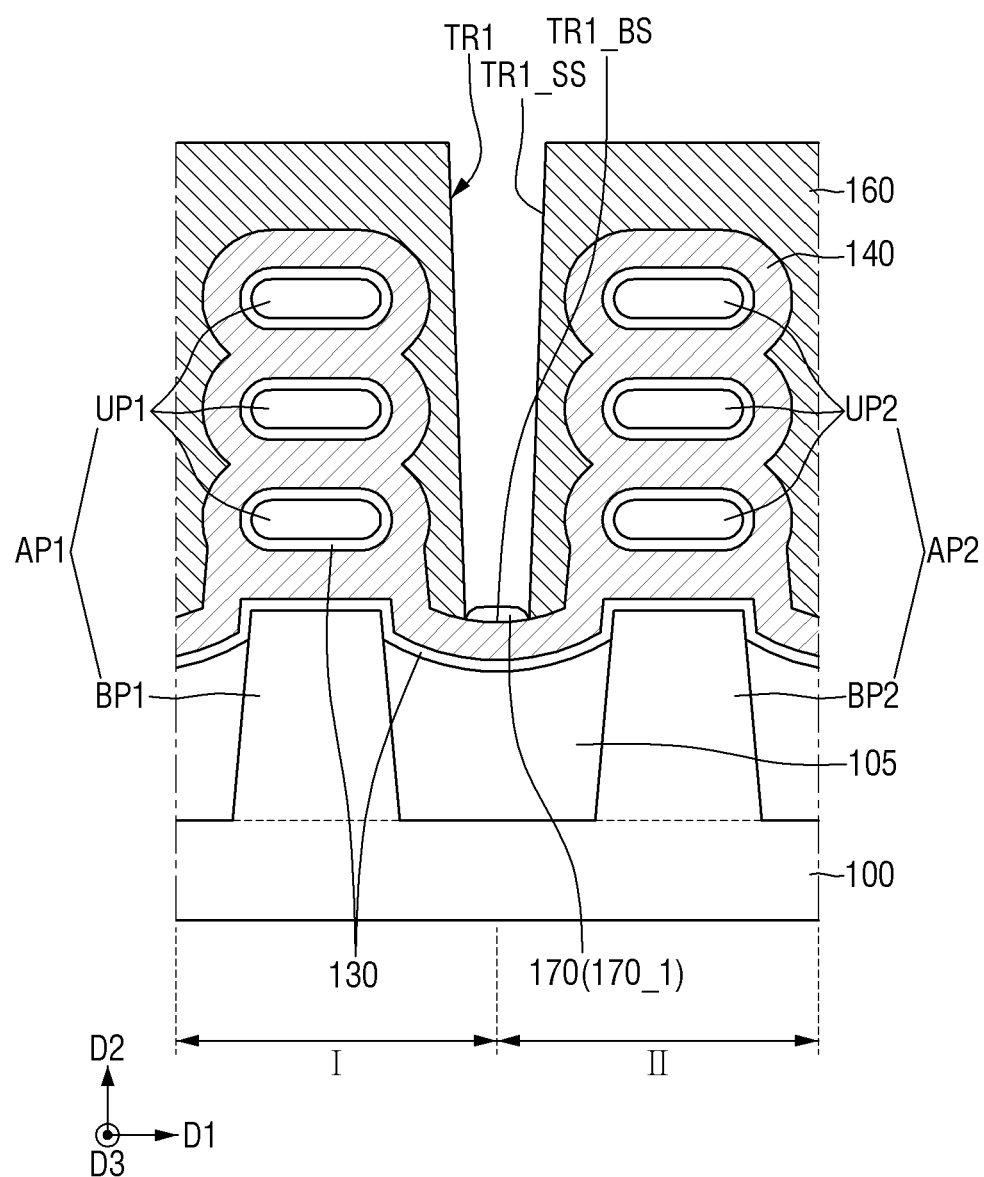

Referring to FIG. 18, the inhibitor layer 170 formed along the side surface TR1_SS of the first trench TR1 may be selectively removed.

For example, the second portion 170_2 of the inhibitor layer 170 may be selectively removed. While the second portion 170_2 of the inhibitor layer 170 is removed, the first portion 170_1 of the inhibitor layer 170 is not removed. The second portion 170_2 of the inhibitor layer 170 is removed and the surface of the sacrificial layer 160 may be exposed again.

Specifically, the second portion 170_2 of the inhibitor layer 170 may be selectively removed through the heat treatment process. The heat treatment process may be performed under temperature conditions of from about 150° C. to about 250° C. The heat treatment process may proceed for a time of at least about 1 minute to about 3 minutes. When the heat treatment process is performed, hydrogen cations (H$^+$) are emitted in the sacrificial layer 160. The emitted hydrogen cations may react with the inhibitor layer 170 on the side surface TR1_SS of the first trench TR1. Since the inhibitor layer 170 includes a material that is dissociated by an acid, the inhibitor layer 170 may be dissociated when the inhibitor layer 170 reacts with a hydrogen cation.

On the other hand, even if the heat treatment process is performed, the first portion 170_1 of the inhibitor layer 170 is not removed. Even if the heat treatment process is performed, hydrogen cations are not generated inside the work function metal layer 140. The inhibitor layer 170 on the bottom surface TR1_BS of the first trench TR1 does not react with hydrogen cations. That is, the inhibitor layer 170 on the bottom surface TR1_BS of the first trench TR1 is not removed.

In some embodiments, the upper surface of the first portion 170_1 of the inhibitor layer 170 may not be flat after the second portion 170_2 of the inhibitor layer 170 is removed. For example, the upper surface of the first portion 170_1 of the inhibitor layer 170 may be concave with respect to the substrate 100. As a part of the first portion 170_1 of the inhibitor layer 170 that is in contact with the side surface TR1_SS of the first trench TR1 is removed, the upper surface of the first portion 170_1 of the inhibitor layer 170 may not be flat.

Figure 19:
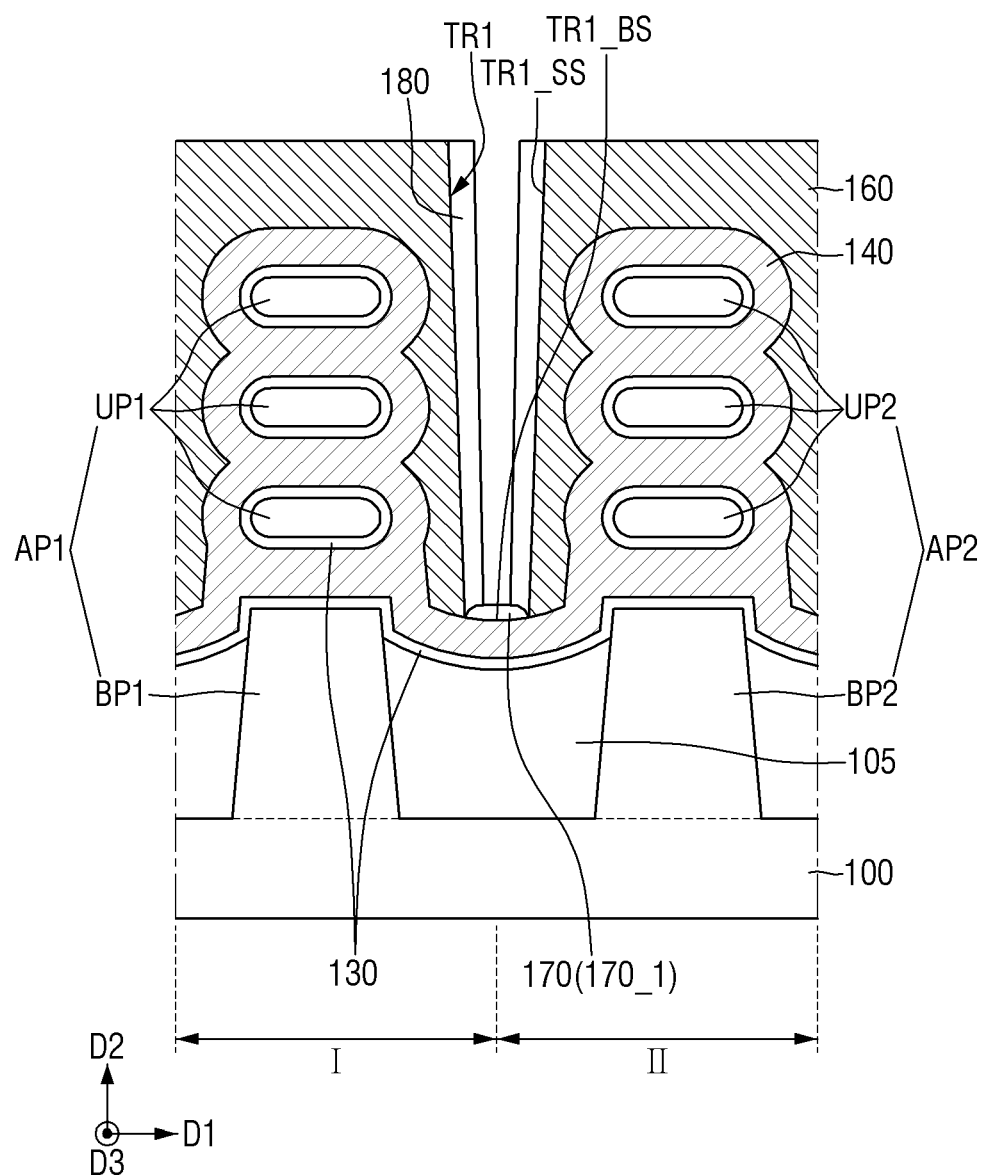

Referring to FIG. 19, an interest layer 180 may be deposited on the side surface TR1_SS of the first trench TR1. The interest layer 180 is not deposited on the first portion 170_1 of the inhibitor layer 170 in the second direction D2.

The interest layer 180 may be deposited on the surface of the exposed sacrificial layer 160. The interest layer 180 may be deposited using, for example, chemical vapor deposition (CVD). The interest layer 180 may be deposited on the surface of the sacrificial layer 160 in the first direction D1, but is not limited thereto. The interest layer 180 may be deposited to narrow the spaced distance between the interest layers 180 in the first direction D1.

The interest layer 180 may include an organic material and an inorganic material. For example, the interest layer 180 may include, but is not limited to, silicon oxide or aluminum oxide.

Figure 20:
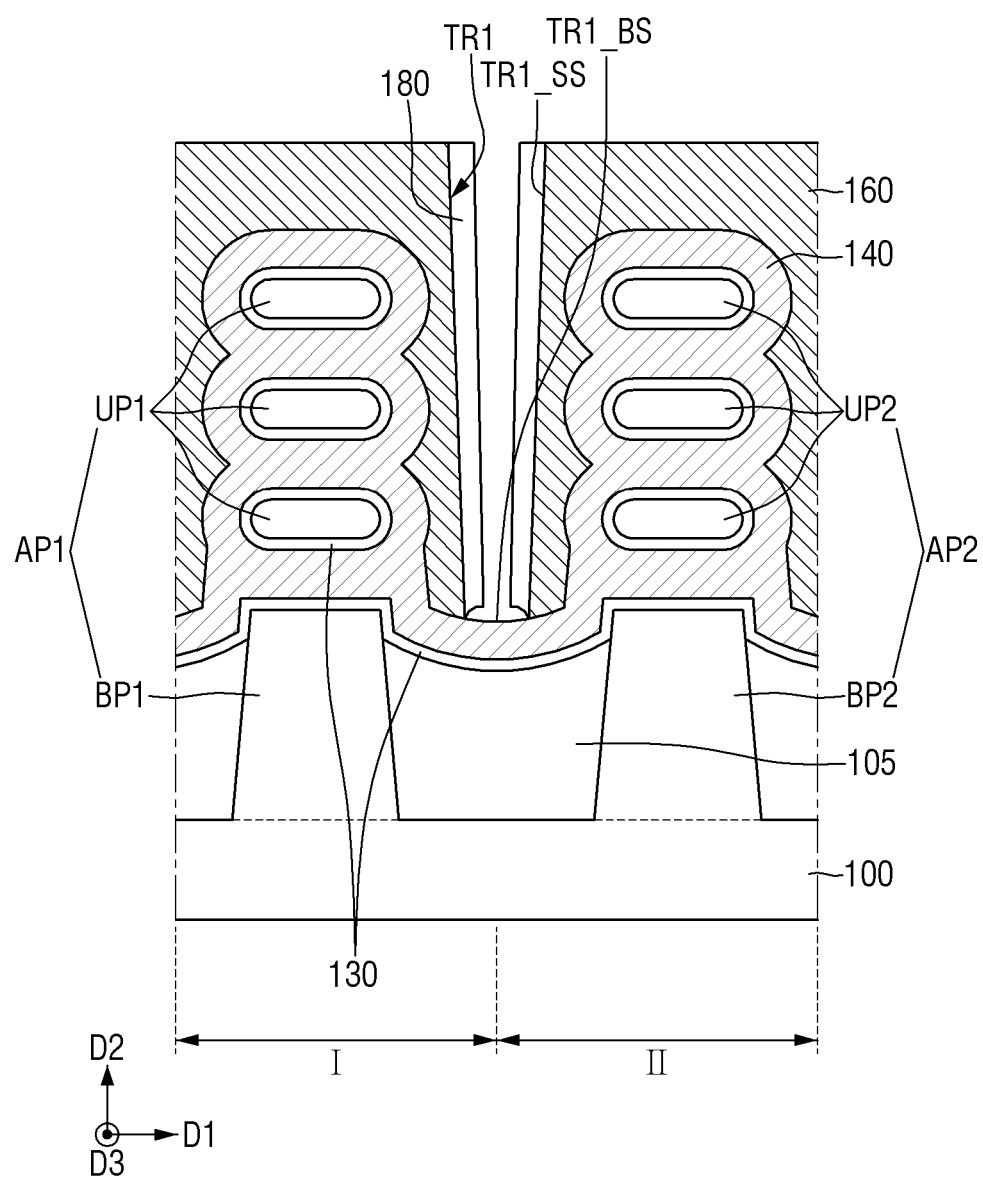

Referring to FIG. 20, the inhibitor layer 170 on the bottom surface TR1_BS of the first trench TR1 may be removed. The first portion 170_1 of the inhibitor layer 170 may be removed.

The inhibitor layer 170 on the bottom surface TR1_BS of the first trench TR1 may be removed, using an acid treatment process. As mentioned above, the inhibitor layer 170 includes a material that can be dissociated by acid or hydrogen cation. Therefore, when supplying a hydrogen cation to the inhibitor layer 170, the inhibitor layer 170 may be removed.

In some embodiments, as the first portion 170_1 of the inhibitor layer 170 is removed, an empty space may be generated between the interest layer 180 and the work function metal layer 140. That is, the work function metal layer 140 and the interest layer 180 may be spaced apart from each other in the second direction D2.

As mentioned above, the inhibitor layer 170 needs to be formed to have a very thin thickness. For example, the thickness of the first portion 170_1 of the inhibitor layer 170 in the second direction D2 may be equal to or less than about 10 angstroms (Å). If the thickness of the first portion 170_1 of the inhibitor layer 170 in the second direction D2 is thin, the empty space between the interest layer 180 and the work function metal layer 140 may be narrowed. In this case, when performing the subsequent process of removing the work function metal layer 140, because less etchant penetrates between the empty spaces, it is possible to manufacture a semiconductor device in which the reliability is improved.

Figure 21A:
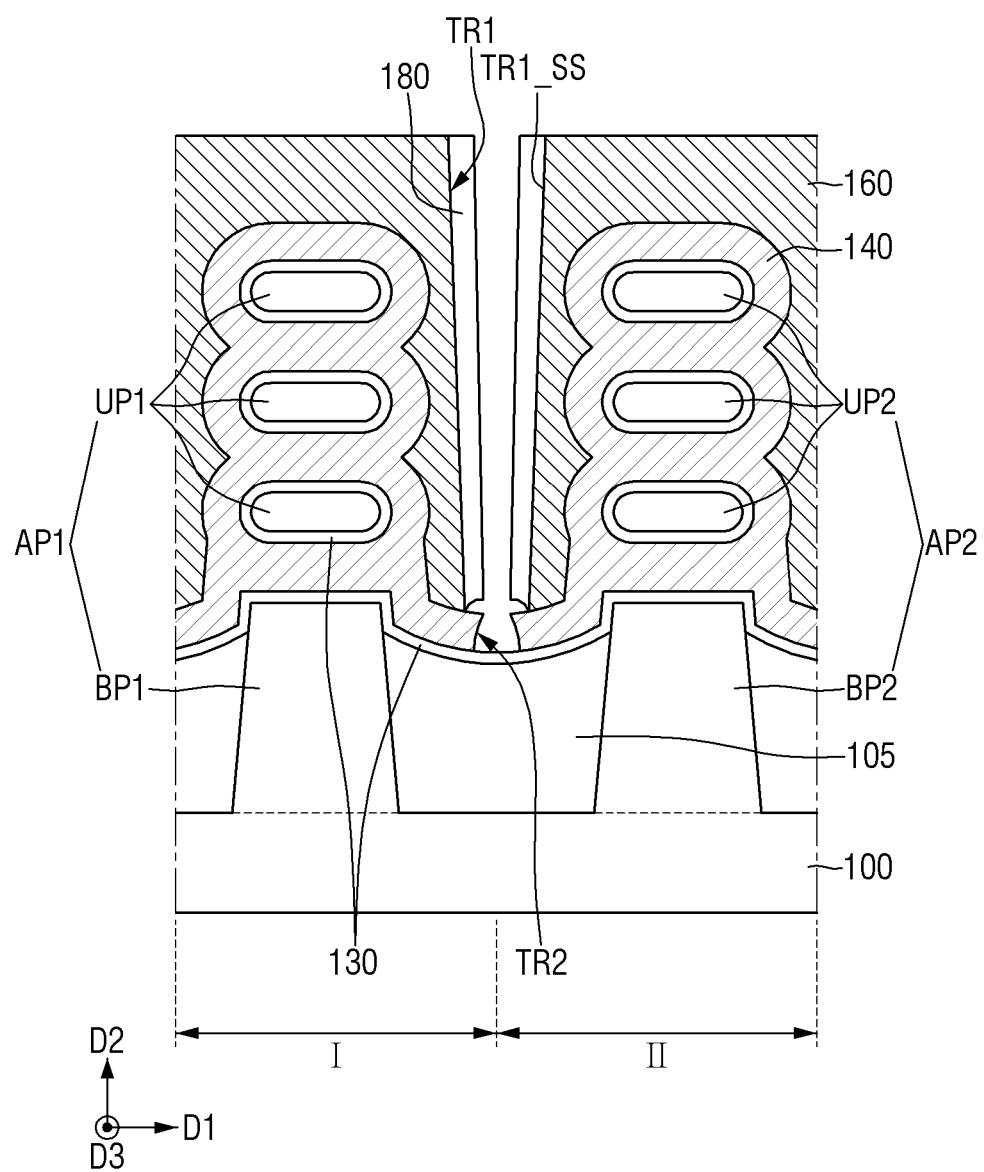
Figure 21B:
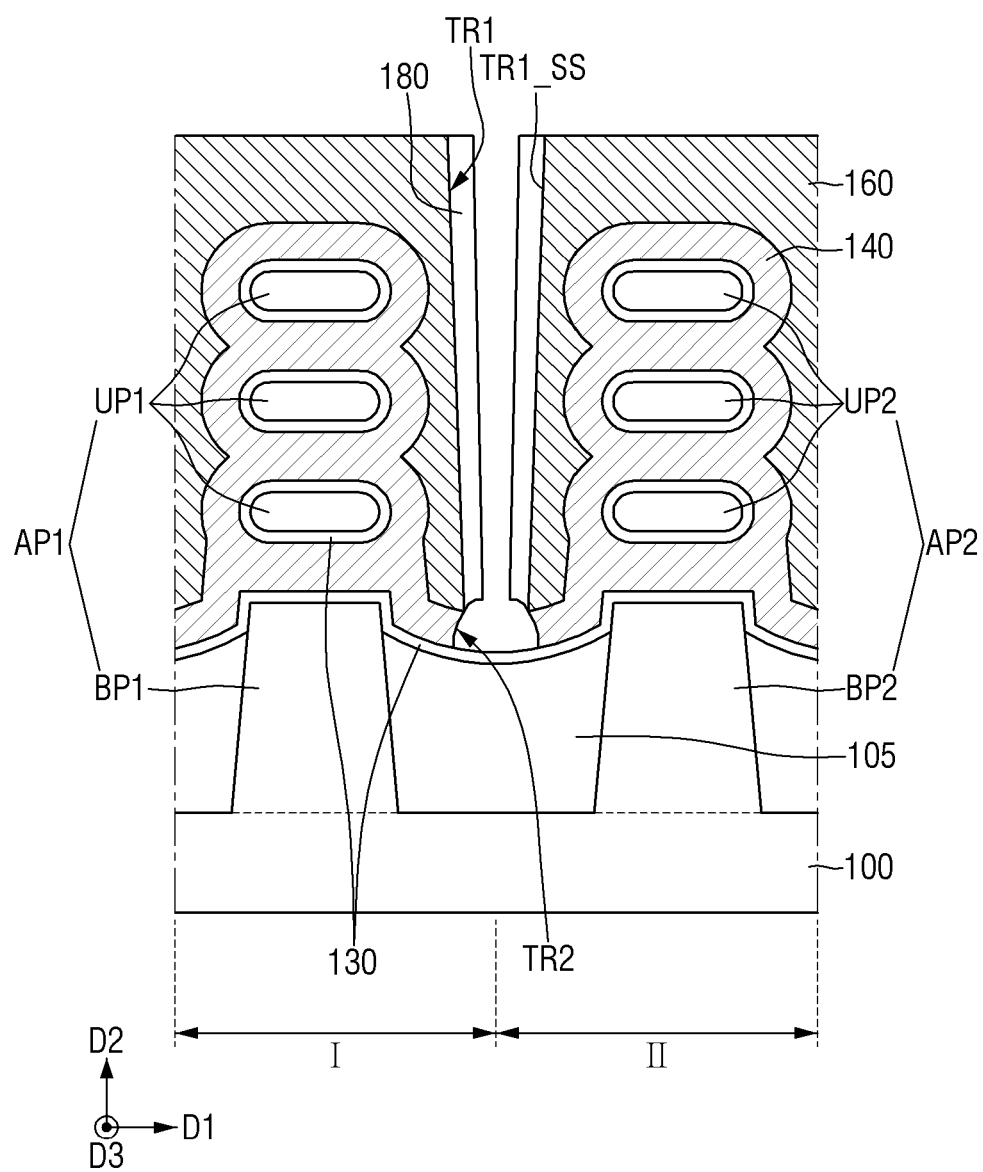

Referring to FIGS. 21a and 21b, a part of the work function metal layer 140 may be removed to expose the gate insulating film 130. A part of the work function metal layer 140 may be removed to form a second trench TR2.

That is, the work function metal layer 140 on the first region I and the work function metal layer 140 on the second region II may be separated. The work function metal layer 140A may be removed, using a wet etching process. Therefore, the work function metal layer 140 may be removed through isotropic etching. As the work function metal layer 140 is removed through the isotropic etching, the second trench TR2 may have a portion whose width increases in the first direction D1 from the upper surface of the work function metal layer 140 toward the substrate 100.

In some embodiments, the width of the open first trench TR1 in the first direction D1 may be reduced, using the interest layer 180. Accordingly, only a small amount of etchant may penetrate the work function metal layer 140. In addition, since the thickness of the inhibitor layer 170 is thin, only a small amount of etchant may penetrate the work function metal layer 140.

In FIG. 21a, the width of the second trench TR2 in the first direction D1 may be smaller than the width of the first trench TR1 in the first direction D1. Here, the width of the second trench TR2 in the first direction D1 means the largest width among the widths of the second trench TR2 in the first direction D1, and the width of the first trench TR1 in the first direction D1 may mean the smallest width among the widths of the first trench TR1 in the first direction D1.

On the other hand, in FIG. 21b, the width of the second trench TR2 in the first direction D1 may be larger than the width of the first trench TR1 in the first direction D1. That is, the largest portion among the widths of the second trench TR2 in the first direction D1 may be larger than the smallest portion among the widths of the first trench TR1 in the first direction D1.

Figure 22:
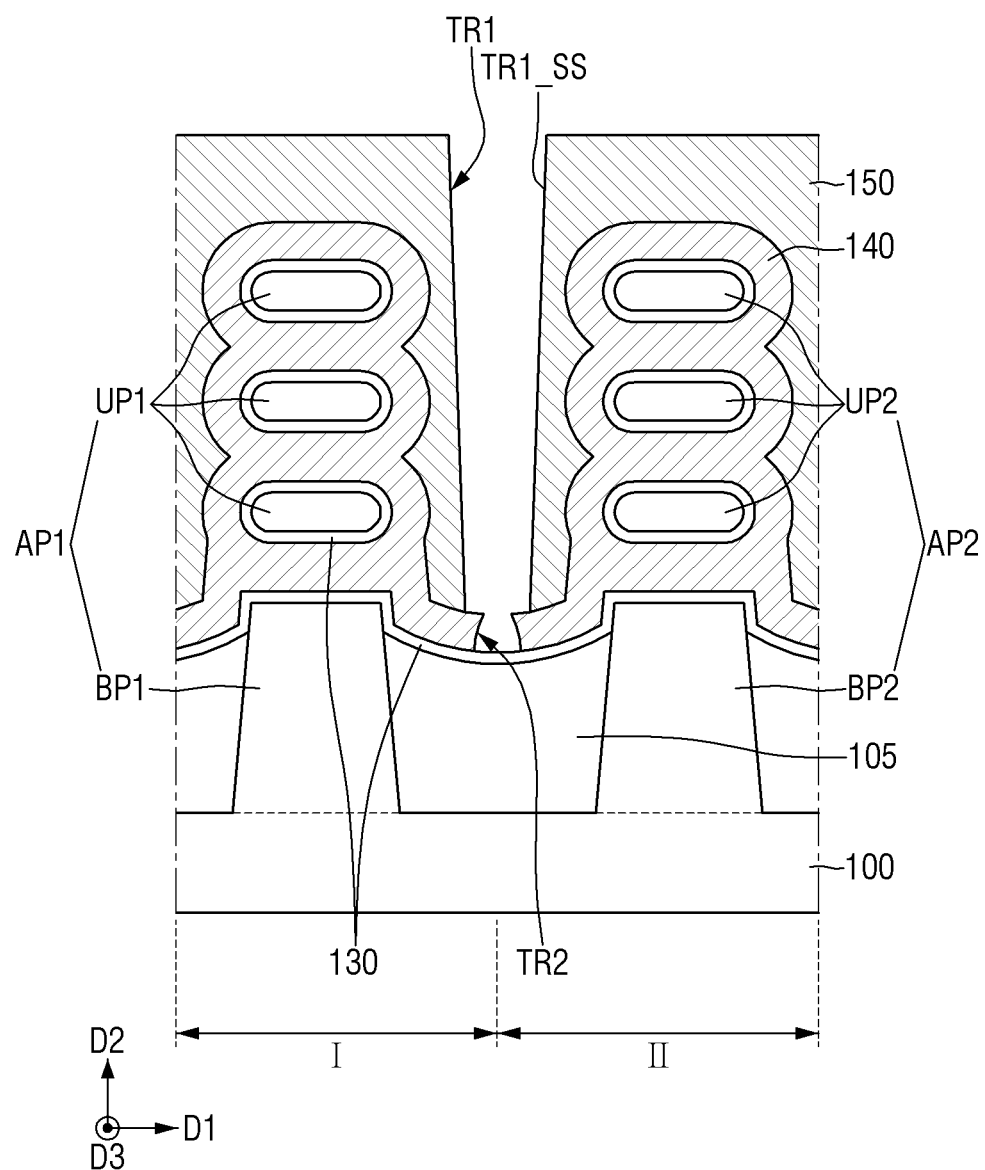

Referring to FIG. 22, the gap fill insulating material in the interest layer 180 and the sacrificial layer 160 may be removed.

The gap fill insulating material in the sacrificial layer 160 may be removed to form the protective layer 150. The interest layer 180 may be removed to expose the surface of the protective layer 150. A part of the work function metal layer 140 and a part of the gate insulating film 130 may also be exposed by the first trench TR1 and the second trench TR2.

The gap fill insulating material inside the interest layer 180 and the sacrificial layer 160 may be removed, using a wet etching process or an ashing process. However, the technical idea of the present inventive concept is not limited thereto.

Figure 23:
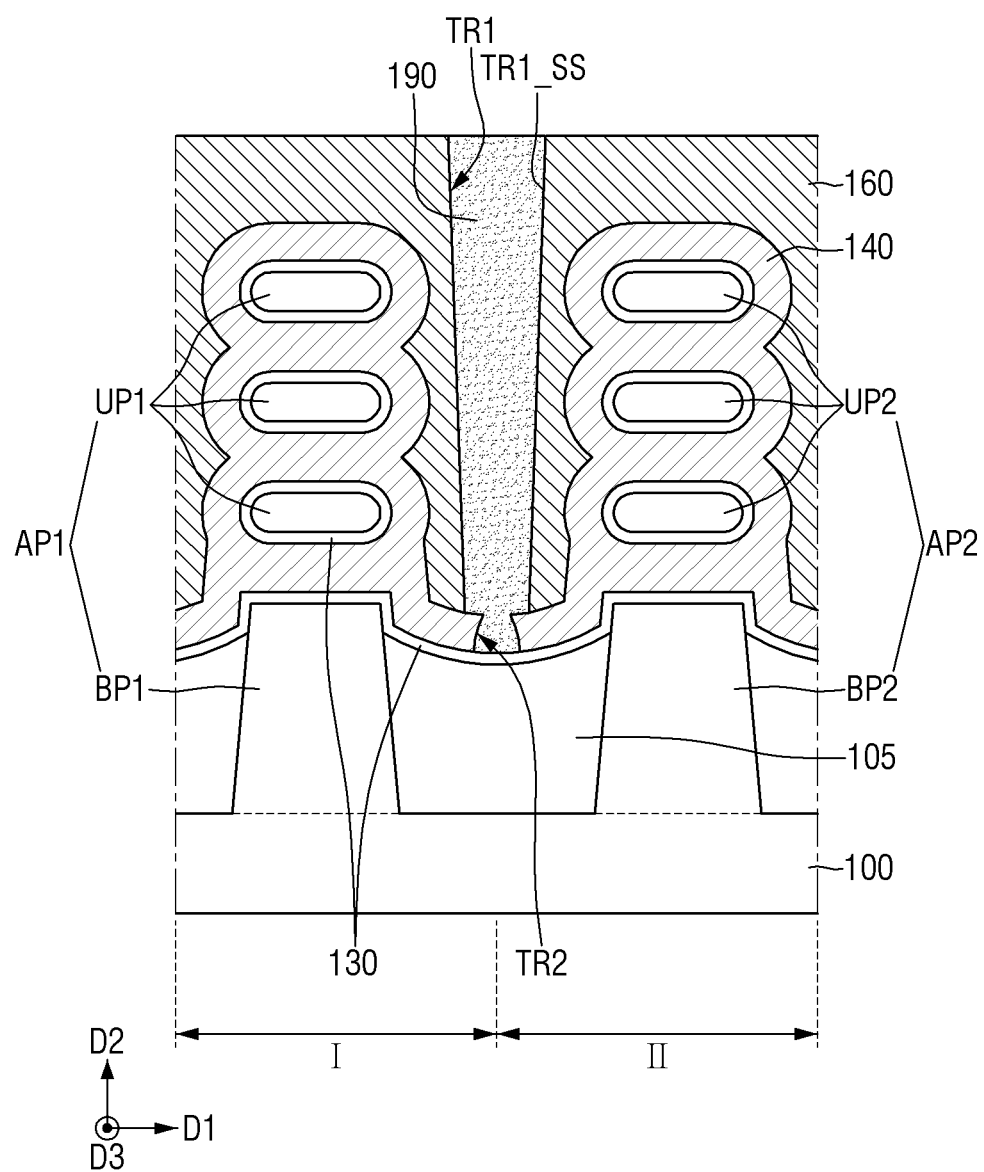

Referring to FIG. 23, a gap fill insulating layer 190 may be formed on the substrate 100.

A gap fill insulating material may be applied onto the substrate 100. The applied gap fill insulating material may be combined with the protective layer 150 to form the sacrificial layer 160. The gap fill insulating material may fill the first trench TR1 and the second trench TR2. The gap fill insulating material may fill the first trench TR1 and the second trench TR2 to form the gap fill insulating layer 190. That is, the gap fill insulating layer 190 may cover the exposed gate insulating film 130 and the exposed work function metal layer 140.

The gap fill insulating layer 190 may include, for example, a gap fill insulating material. As another example, the gap fill insulating layer 190 may be, but is not limited to, a dry etch resistance layer or a wet etch resistance layer.

Figure 24:
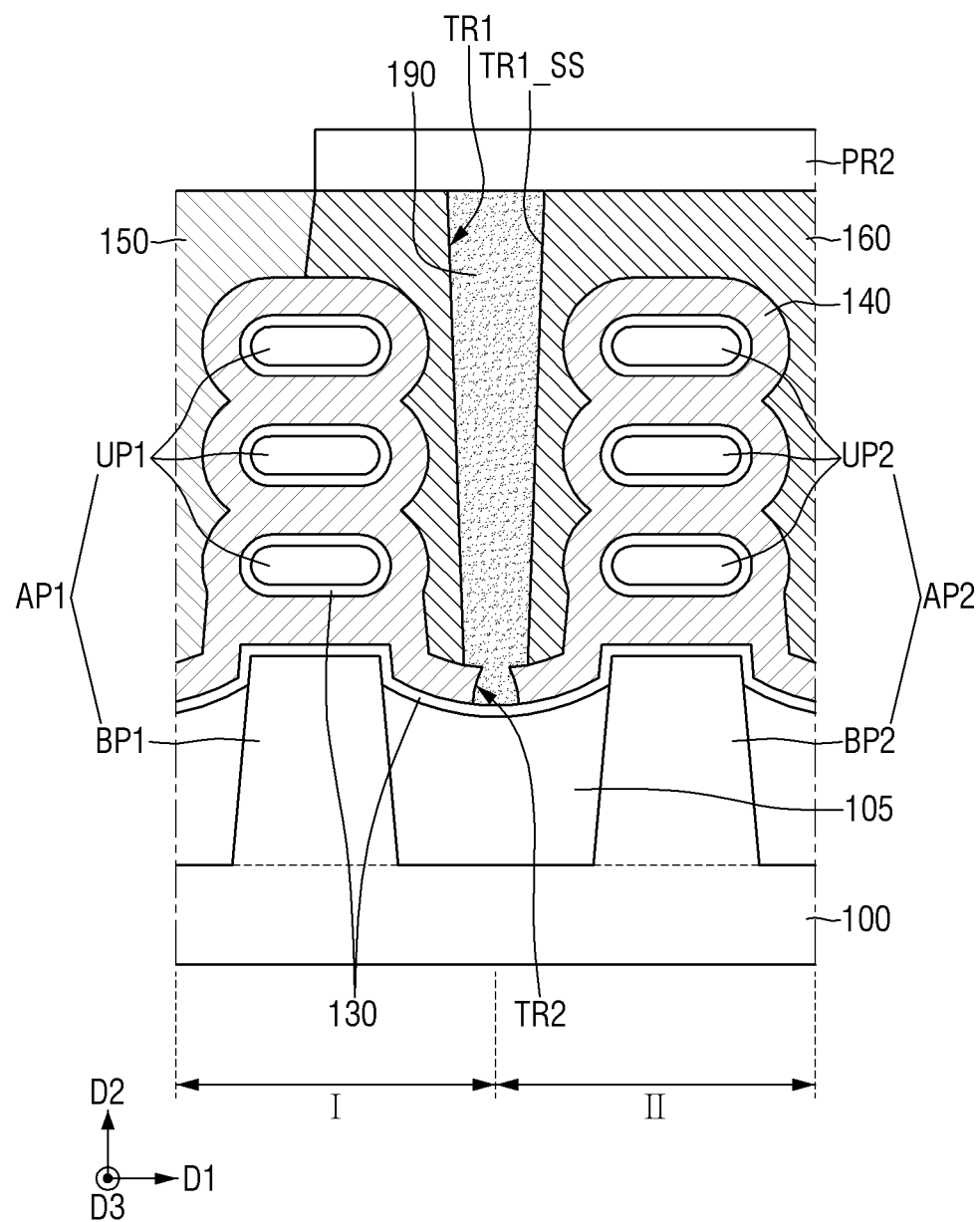

Referring to FIG. 24, a second photoresist PR2 may be formed on the sacrificial layer 160 and the gap fill insulating layer 190.

The second photoresist PR2 may cover the sacrificial layer 160 on the second region II, a part of the sacrificial layer 160 on the first region I, and the gap fill insulating layer 190.

The second photoresist PR2 may be formed of at least one of a photoresist film, an ACL (Amorphous Carbon Layer), a SOH (Spin on Hardmask), an SOC (Spin on Carbon), and a silicon nitride film.

Next, the gap fill insulating material inside the sacrificial layer 160 may be removed, using the second photoresist PR2 as a mask. The gap fill insulating material inside the sacrificial layer 160 may be removed to form the protective layer 150. The gap fill insulating material inside the sacrificial layer 160 may be removed, but is not limited to, using a dry etching process.

Figure 25:
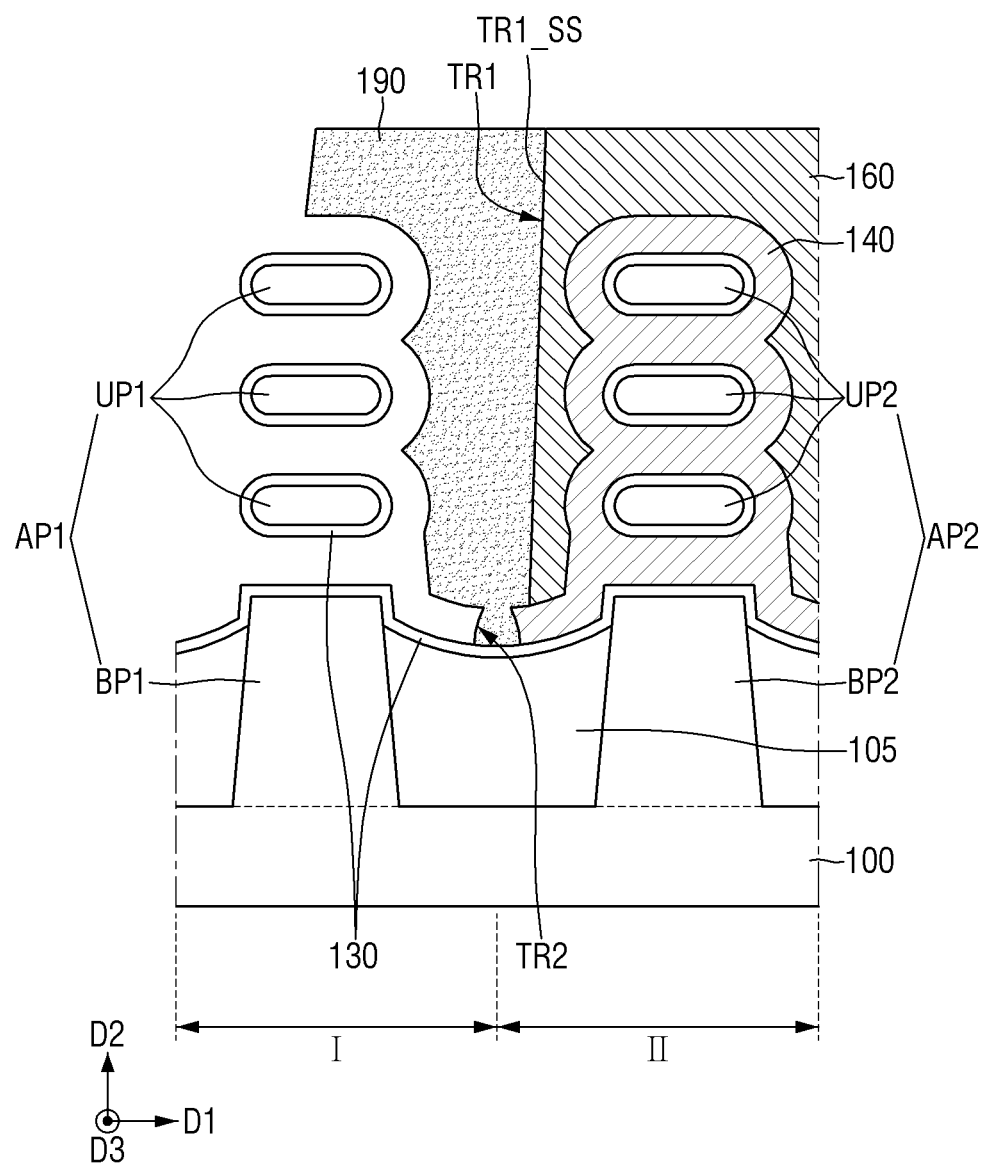

Referring to FIG. 25, the protective layer 150 and the work function metal layer 140 of the first region I may be removed. Only the protective layer 150 of the first region I may be selectively removed.

The protective layer 150 and the work function metal layer 140 of the first region (I) may be removed, using a wet etching process. When the wet etching process is used, the protective layer 150 and the work function metal layer 140 are removed, but the gap fill insulating material and the gap fill insulating layer 190 may not be removed. The etchant of the wet etching process may not penetrate the gap fill insulating material and the gap fill insulating layer 190. Therefore, the etchant may not reach the sacrificial layer 160 of the second region II. The sacrificial layer 160 of the second region II may not be removed.

That is, the protective layer 150 and the work function metal layer 140 of the first region I may be selectively removed.

Figure 26:
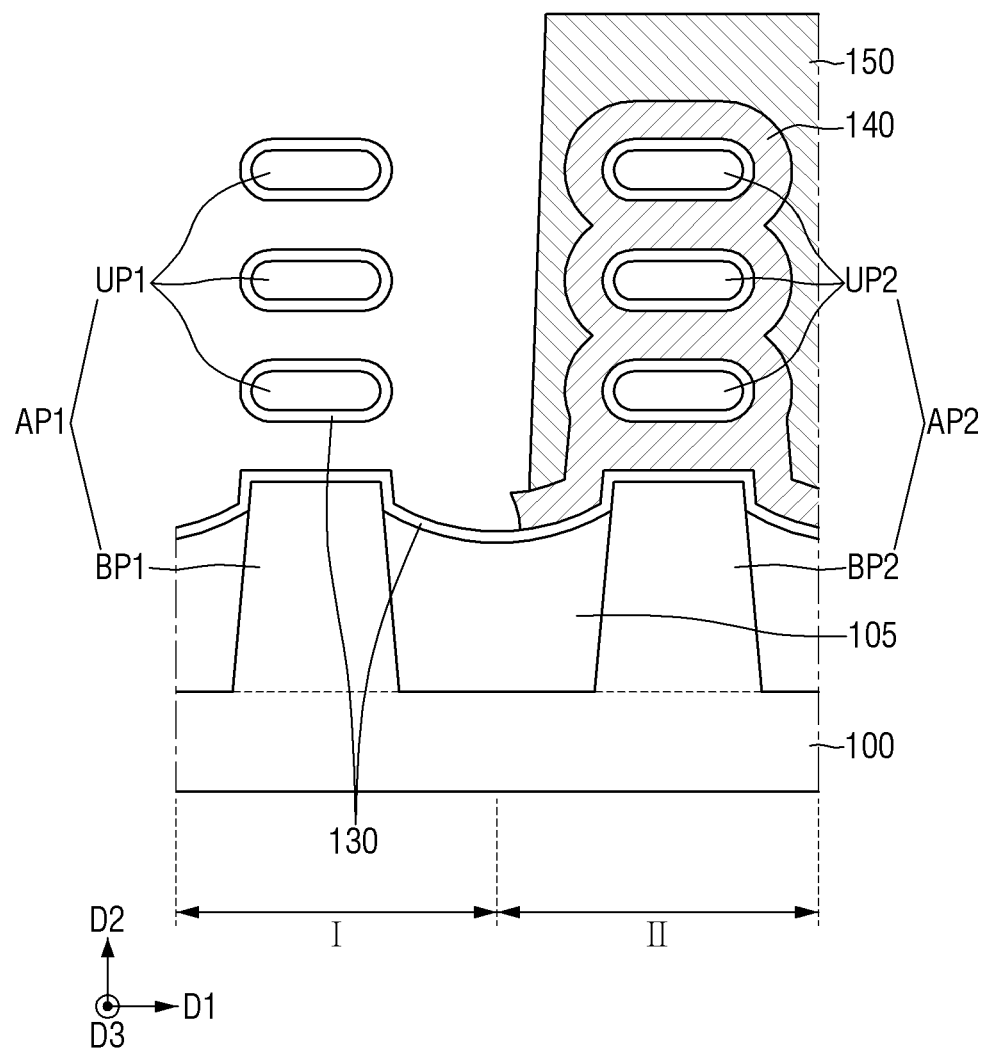

Referring to FIG. 26, the gap fill insulating layer 190 and the gap fill insulating material inside the sacrificial layer 160 of the second region II may be removed.

The gap fill insulating material inside the sacrificial layer 160 of the second region II may be removed to form the protective layer 150. The gap fill insulating layer 190 and the gap fill insulating material inside the sacrificial layer 160 of the second region II may be removed through, but is not limited to, a wet etching process or an ashing process.

In some embodiments, all the work function metal layers 140 on the first region I are removed, and the work function metal layers 140 on the second region II are not removed through the aforementioned process. The gate insulating film 130 that wraps around the first sheet pattern UP1 is exposed, and the gate insulating film 130 that wraps around the second sheet pattern UP2 is not exposed.

In some embodiments, an NMOS may be formed in the first region I, and a PMOS may be formed in the second region II, but is not limited thereto.

In concluding the detailed description, those skilled in the art will appreciate that many variations and modifications may be made to the example embodiments without substantially departing from the scope of the present inventive concept. Therefore, the disclosed example embodiments of the disclosure are used in a generic and descriptive sense only and not for purposes of limitation.

What is claimed is:

1. A method for manufacturing a semiconductor device, the method comprising:
   providing a first layer comprising a first surface;
   forming a second layer on the first layer such that a portion of the first surface is not covered by the second layer, wherein the second layer comprises a second surface that meets the first surface, wherein the second layer comprises a first sub-layer and a second sub-layer spaced apart from each other, and wherein the portion of the first surface not covered by the second layer is between the first sub-layer and the second sub-layer;
   forming an inhibitor layer on the first surface and the second surface;
   selectively removing the inhibitor layer from the second surface to expose the second surface;

forming an interest layer on the second surface; and
removing the inhibitor layer from the first surface by performing an acid treatment process, wherein the inhibitor layer on the first surface reacts with acid or hydrogen ion and is dissociated,
wherein physical properties of the first layer are different from physical properties of the second layer.

2. The method for manufacturing the semiconductor device of claim 1, wherein the selectively removing the inhibitor layer from the second surface comprises performing a heat treatment process, and
the inhibitor layer on the first surface is not removed by the heat treatment process.

3. The method for manufacturing the semiconductor device of claim 2, wherein the heat treatment process is performed at 150° C. or more and 250° C. or less.

4. The method for manufacturing the semiconductor device of claim 1, wherein the inhibitor layer comprises at least one of hexamethyldisilazane (HMDS), trimethylsilyldiethylamine, bis(N,N-dimethylamino)dimethylsilane, trimethylsilyldimethylamine, bis(trimethylsilyl) hydrazine, and trimethylchlorosilane.

5. The method for manufacturing the semiconductor device of claim 1, wherein a width of the inhibitor layer is 10 Å or less.

6. The method for manufacturing the semiconductor device of claim 1, wherein the first layer comprises at least one of titanium nitride, an organic polymer, and a combination thereof.

7. A method for manufacturing a semiconductor device, the method comprising:
forming a gap fill insulating layer on a titanium nitride layer;
etching the gap fill insulating layer to form a first gap fill insulating pattern and a second gap fill insulating pattern, the first gap fill insulating pattern comprising a first surface facing the second gap fill insulating pattern, and the second gap fill insulating pattern comprising a second surface facing the first surface, wherein the first gap fill insulating pattern and the second gap fill insulating pattern expose an upper surface of the titanium nitride layer;
forming a first inhibitor layer on the upper surface of the titanium nitride layer;
forming a second inhibitor layer on the first surface and the second surface;
selectively removing the second inhibitor layer using a heat treatment process to expose the first surface and the second surface; and
depositing an interest layer on the first surface and the second surface, wherein the interest layer exposes the first inhibitor layer.

8. The method for manufacturing the semiconductor device of claim 7, wherein the first inhibitor layer is not removed by the heat treatment process.

9. The method for manufacturing the semiconductor device of claim 7, wherein the heat treatment process is performed at 150° C. or more and 250° C. or less.

10. The method for manufacturing the semiconductor device of claim 7, further comprising:
performing an acid treatment process to remove the first inhibitor layer after the depositing the interest layer.

11. The method for manufacturing the semiconductor device of claim 7, wherein the first inhibitor layer and the second inhibitor layer comprise at least one of hexamethyldisilazane (HMDS), trimethylsilyldiethylamine, bis(N,N-dimethylamino)dimethylsilane, trimethylsilyldimethylamine, bis(trimethylsilyl) hydrazine, and trimethylchlorosilane.

12. The method for manufacturing the semiconductor device of claim 7, wherein the first and second inhibitor layers are formed at 80° C. or more and 240° C. or less.

13. The method for manufacturing the semiconductor device of claim 7, wherein a width of the first inhibitor layer is 10 Å or less.

14. A method for manufacturing a semiconductor device, the method comprising:
forming a first sheet pattern on a first region of a substrate;
forming a second sheet pattern on a second region of the substrate;
forming a work function metal layer on the substrate, wherein the work function metal layer extends around the first sheet pattern and the second sheet pattern;
forming a sacrificial layer on the first and second sheet patterns;
forming a trench that penetrates the sacrificial layer between the first sheet pattern and the second sheet pattern, wherein the trench exposes a portion of the work function metal layer;
forming an inhibitor layer on a bottom surface and a side surface of the trench;
performing a heat treatment process to selectively remove the inhibitor layer from the side surface of the trench; and
selectively forming an interest layer on the side surface of the trench,
wherein the work function metal layer comprises titanium nitride.

15. The method for manufacturing the semiconductor device of claim 14, further comprising:
performing a wet etching process to selectively remove a portion of the work function metal layer that is overlapped by the trench after the selectively forming the interest layer.

16. The method for manufacturing the semiconductor device of claim 14, further comprising:
removing the work function metal layer from the first region.

17. The method for manufacturing the semiconductor device of claim 16, wherein an NMOS transistor is formed on the first region, and
a PMOS transistor is formed on the second region.

18. The method for manufacturing the semiconductor device of claim 14, wherein the heat treatment process is performed at 150° C. or more and 250° C. or less.

* * * * *